United States Patent
Kim et al.

(10) Patent No.: US 12,387,797 B2
(45) Date of Patent: Aug. 12, 2025

(54) MEMORY DEVICE AND OPERATING METHOD THEREOF

(71) Applicant: SAMSUNG ELECTRONICS CO., LTD., Suwon-si (KR)

(72) Inventors: Seungbum Kim, Suwon-si (KR); Yonghyuk Choi, Suwon-si (KR); Hyun Seo, Suwon-si (KR); Seungyong Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 168 days.

(21) Appl. No.: 18/242,232

(22) Filed: Sep. 5, 2023

(65) Prior Publication Data
US 2024/0203509 A1 Jun. 20, 2024

(30) Foreign Application Priority Data
Dec. 19, 2022 (KR) .................. 10-2022-0178684

(51) Int. Cl.
*G11C 16/34* (2006.01)
*G11C 16/10* (2006.01)
*G11C 16/26* (2006.01)
G11C 16/04 (2006.01)
G11C 16/08 (2006.01)

(52) U.S. Cl.
CPC .............. *G11C 16/26* (2013.01); *G11C 16/10* (2013.01); *G11C 16/0483* (2013.01); *G11C 16/08* (2013.01)

(58) Field of Classification Search
CPC ................................ G11C 16/34; G11C 11/56
See application file for complete search history.

(56) References Cited

U.S. PATENT DOCUMENTS

| | | |
|---|---|---|
| 7,796,441 B2 | 9/2010 | Kang et al. |
| 8,614,917 B2 | 12/2013 | Shim et al. |
| 9,978,453 B2 | 5/2018 | Lee |
| 10,347,647 B1 | 7/2019 | Hosoda et al. |

(Continued)

OTHER PUBLICATIONS

Communication issued Mar. 18, 2024 by the European Patent Office in European Patent Application No. 23197049.2.

*Primary Examiner* — Jason Lappas
(74) *Attorney, Agent, or Firm* — Sughrue Mion, PLLC

(57) ABSTRACT

A memory device comprises: a memory cell array including a plurality of cell blocks including a first cell block storing information other than user data and a second cell block storing the user data, wherein each of the plurality of cell blocks includes a plurality of cell strings and control circuitry configured to control a write operation and a read operation of the memory cell array. A first ground select line (GSL) region included in the first cell block includes a plurality of GSLs stacked in a vertical direction. One or more ground select transistors of a plurality of ground select transistors connected to each of the GSLs are programmed to a first threshold voltage and the other ground select transistors of the plurality of ground select transistors not connected to the GSLs are programmed to a second threshold voltage that is higher than the first threshold voltage. A first line included in the first GSL region in the first cell block is arranged at a same height as a word line connected to memory cells storing the user data in the second cell block.

20 Claims, 27 Drawing Sheets

(56) References Cited

U.S. PATENT DOCUMENTS

| | | |
|---|---|---|
| 10,510,771 B2 | 12/2019 | Nam et al. |
| 10,593,691 B2 | 3/2020 | Umezawa et al. |
| 10,971,238 B2 | 4/2021 | Kanamori et al. |
| 11,132,312 B2 | 9/2021 | Kim et al. |
| 2013/0215679 A1 | 8/2013 | Lee et al. |
| 2019/0171381 A1* | 6/2019 | Ioannou ................ G06F 3/0679 |
| 2020/0279608 A1 | 9/2020 | Shibata et al. |

* cited by examiner

MEMORY DEVICE AND OPERATING METHOD THEREOF

CROSS-REFERENCE TO RELATED APPLICATION

This application is based on and claims priority under 35 U.S.C. § 119 to Korean Patent Application No. 10-2022-0178684, filed on Dec. 19, 2022, in the Korean Intellectual Property Office, the disclosure of which is incorporated by reference herein in its entirety.

BACKGROUND

The embodiments of the present disclosure relate to a memory device, and more particularly, to a memory device for increasing the reliability of data and an operating method thereof.

Non-volatile memory devices include a plurality of memory cells that store data in a non-volatile way. For example, a flash memory device may be used in a cellular phone, a digital camera, a personal digital assistant (PDA), a mobile computing system, a stationary computing system, and other devices.

To increase the capacity of memory devices, three-dimensional (3D) memory devices including a plurality of vertical channel structures extending on a substrate in a vertical direction have been developed. To increase the integration density of memory devices, approaches for increasing the number of word lines stacked above a substrate in a vertical direction or removing a dummy hole from memory devices have been proposed.

However, the increase in the integration density of memory devices causes interference among word lines, string select lines, and ground select lines to increase, and accordingly, the reliability of data may be degraded. For example, the reliability of main data related to the configuration and operations of memory devices needs to be maintained despite the increase of the integration density of the memory devices.

SUMMARY

The embodiments of the present disclosure provide a memory device for increasing integration density and the reliability of data and an operating method thereof.

According to one or more embodiments, a memory device comprises: a memory cell array including a plurality of cell blocks including a first cell block storing information other than user data and a second cell block storing the user data, wherein each of the plurality of cell blocks includes a plurality of cell strings; and control circuitry configured to control a write operation and a read operation of the memory cell array, wherein a first ground select line (GSL) region included in the first cell block includes a plurality of GSLs stacked in a vertical direction, wherein one or more ground select transistors of a plurality of ground select transistors connected to each of the GSLs are programmed to a first threshold voltage and the other ground select transistors of the plurality of ground select transistors not connected to the GSLs are programmed to a second threshold voltage that is higher than the first threshold voltage, and wherein, a first line included in the first GSL region in the first cell block is arranged at a same height as a word line connected to memory cells storing the user data in the second cell block.

According to one or more embodiments, a memory device comprising: a memory cell array including a first cell block storing information other than user data and a second cell block storing the user data, each of the first cell block and the second cell block including first to N-th cell strings connected to a bit line, where N is an integer greater than or equal to 2; and control circuitry configured to control a write operation and a read operation of the memory cell array, wherein each of the first to N-th cell strings of the first cell block includes first to M-th ground select transistors vertically stacked between a word line and a common source line, one of the first to M-th ground select transistors is programmed to a first threshold voltage, and the others of the first to M-th ground select transistors are programmed to a second threshold voltage that is higher than the first threshold voltage, where M is an integer greater than or equal to 2, and each of the first to N-th cell strings of the second cell block includes first to N-th ground select transistors vertically stacked between the word line and the common source line, where N is an integer that is less than M.

According to one or more embodiments, a memory device comprising: a memory cell array including a first cell block storing information other than user data, the first cell block including first to N-th cell strings connected to a bit line, where N is an integer greater than or equal to 2; and control circuitry configured to control a program operation and a read operation of the memory cell array, wherein each of the first to N-th cell strings includes a plurality of first ground select transistors vertically stacked and having a first threshold voltage, a plurality of second ground select transistors vertically stacked and having a second threshold voltage that is higher than the first threshold voltage, and a plurality of third ground select transistors vertically stacked and having the second threshold voltage.

BRIEF DESCRIPTION OF DRAWINGS

Embodiments will be more clearly understood from the following detailed description taken in conjunction with the accompanying drawings in which.

DETAILED DESCRIPTION OF EMBODIMENTS

Hereinafter, various embodiments will be described with reference to the accompanying drawings.

Figure 1:
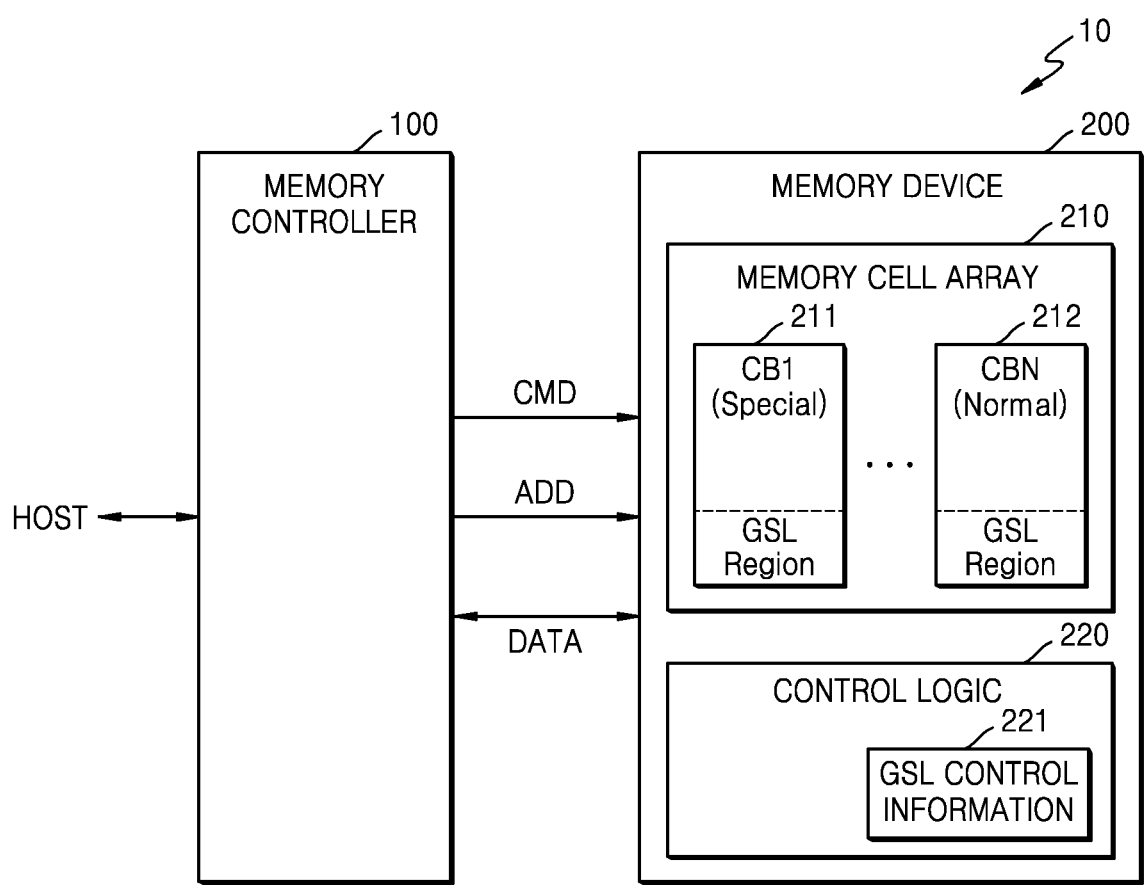
FIG. 1 is a block diagram of a memory system according to one or more embodiments.

FIG. 1 is a block diagram of a memory system according to one or more embodiments.

Referring to FIG. 1, a memory system 10 may include a memory controller 100 and a memory device 200. The memory device 200 may include a memory cell array 210 and a control logic 220 (e.g., control circuitry). In one or more examples, the memory device 200 may further include a voltage generator, which generates various voltages related to programming, reading, and/or erasing of data, a page buffer connected to the memory cell array 210 through bit lines, and other suitable elements known to one of ordinary skill in the art.

According to one or more embodiments, the memory device 200 may include a non-volatile memory device. For example, the memory device 200 may include a non-volatile memory device, such as NAND flash memory, vertical NAND flash memory, NOR flash memory, resistive random access memory (ReRAM), phase-change memory, or magnetoresistive RAM (MRAM). In some embodiments, the memory device 200 or the memory system 10 may be implemented as internal memory embedded in an electronic device or external memory removable from an electronic device. For example, the memory device 200 or the memory system 10 may be implemented in various forms, such as an embedded universal flash storage (UFS) memory device, an embedded multimedia card (eMMC), a solid state drive (SSD), a UFS memory card, a compact flash (CF) card, a secure digital (SD) card, a micro-SD card, a mini-SD card, an extreme digital (xD) card, and a memory stick.

In response to a read or write request from a host, the memory controller 100 may control the memory device 200 to read data stored in the memory device 200 or write (or program) data to the memory device 200. In one or more examples, the memory controller 100 may control the program (e.g., write), read, or erase operation of the memory device 200 by providing an address ADD and a command CMD to the memory device 200. Data to be written to the memory device 200 and data read from the memory device 200 may be exchanged between the memory controller 100 and the memory device 200.

The memory cell array 210 may include a plurality of cell blocks (e.g., first to N-th cell blocks CB1 to CBN). When the memory device 200 corresponds to a vertical NAND flash memory device, each of the first to N-th cell blocks CB1 to CBN may include a plurality of cell strings. For example, a plurality of cell strings may be connected to a bit line, and a selected cell string among the cell strings may be electrically connected to the bit line in a data program or read operation. Each cell block may include a same number of cell strings, or different number of cell strings.

The first to N-th cell blocks CB1 to CBN may store various kinds of data. For example, the first to N-th cell blocks CB1 to CBN may include normal cell blocks that store user data and cell blocks that store various kinds of information other than the user data (e.g., control information, setting information, etc.). Hereinafter, a cell block, to which embodiments are applied, excluding normal cell blocks may be referred to as a special cell block. According to one or more embodiments, special cell blocks may have a different structure than normal cell blocks or may be driven by a different method than the normal cell blocks. For example, special cell blocks may store various kinds of information, such as information data read (IDR) data, which is read to set operating conditions during the initial operation of the memory system 10, or metadata related to operation of the memory system 10. Special cell blocks may be used for a specific purpose without being accessed by normal users. For example, a special cell block may function as a CDROW bloc in a flash memory device and may store information related to bad block of the memory cell array 210. Special cell blocks may store various kinds of information related to security. However, the kinds of data stored in special cell blocks, According to one or more embodiments, do not need to be limited. For example, the memory system 10 may be managed such that information with relatively high importance among user data is also stored in special cell blocks.

According to one or more embodiments, each of the first to N-th cell blocks CB1 to CBN may include a ground select line (GSL) region in which a plurality of GSLs are arranged. For example, assuming that the first cell block CB1 corresponds to a special cell block and the N-th cell block CBN corresponds to a normal cell block, each of the first cell block CB1 and the N-th cell block CBN may include a GSL region. As described above, the GSL region of the first cell block CB1 may have a different physical structure or configuration than the GSL region of the N-th cell block CBN. In one or more examples, the GSL region of the first cell block CB1 and the GSL region of the N-th cell block CBN may be managed or operated differently from each other. For example, a plurality of ground select transistors connected to GSLs in the GSL region of the first cell block CB1 may be differently managed from a plurality of ground select transistors connected to GSLs in the GSL region of the N-th cell block CBN. For example, a plurality of ground select transistors of each of the first to N-th cell blocks CB1 to CBN may be programmed to have certain threshold voltages in a process of manufacturing the memory device 200, wherein the threshold voltages of ground select transistors in the GSL region of the first cell block CB1 may be programmed to be different from the threshold voltages of ground select transistors in the GSL region of the N-th cell block CBN.

According to one or more embodiments, the control logic 220 may include GSL control information 221. For example, the control logic 220 may include a certain storage circuit, such as a fuse circuit or an anti-fuse circuit, which stores information in a non-volatile way, and may control a program operation of a plurality of ground select transistors of the first to N-th cell blocks CB1 to CBN based on the GSL control information 221. According to one or more embodiments, the GSL control information 221 may be configured to be stored in a storage circuit outside the control logic 220 in a process of manufacturing the memory device 200 and may be provided to the control logic 220 during the initial operation of the memory device 200. Alternatively, the GSL control information 221 may be stored in the memory cell array 210 and provided to the control logic 220. The control logic 220 may be configured with the GSL control information by a source external to the memory device 200.

Figure 2A:
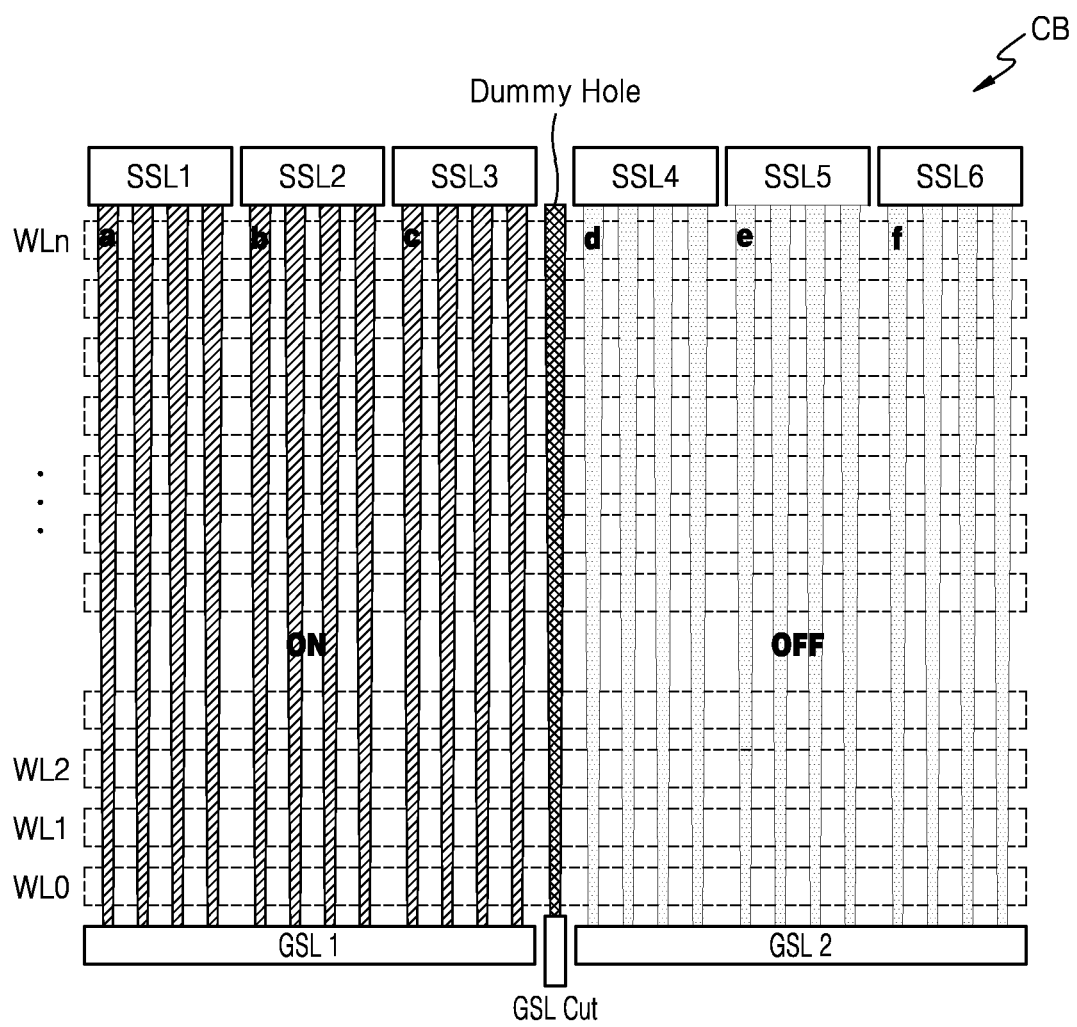
FIGS. 2A and 2B are respectively cross-sectional views of a cell block having a ground select line (GSL) cut structure including a dummy hole and a cell block having a structure without a dummy hole.
Figure 2B:
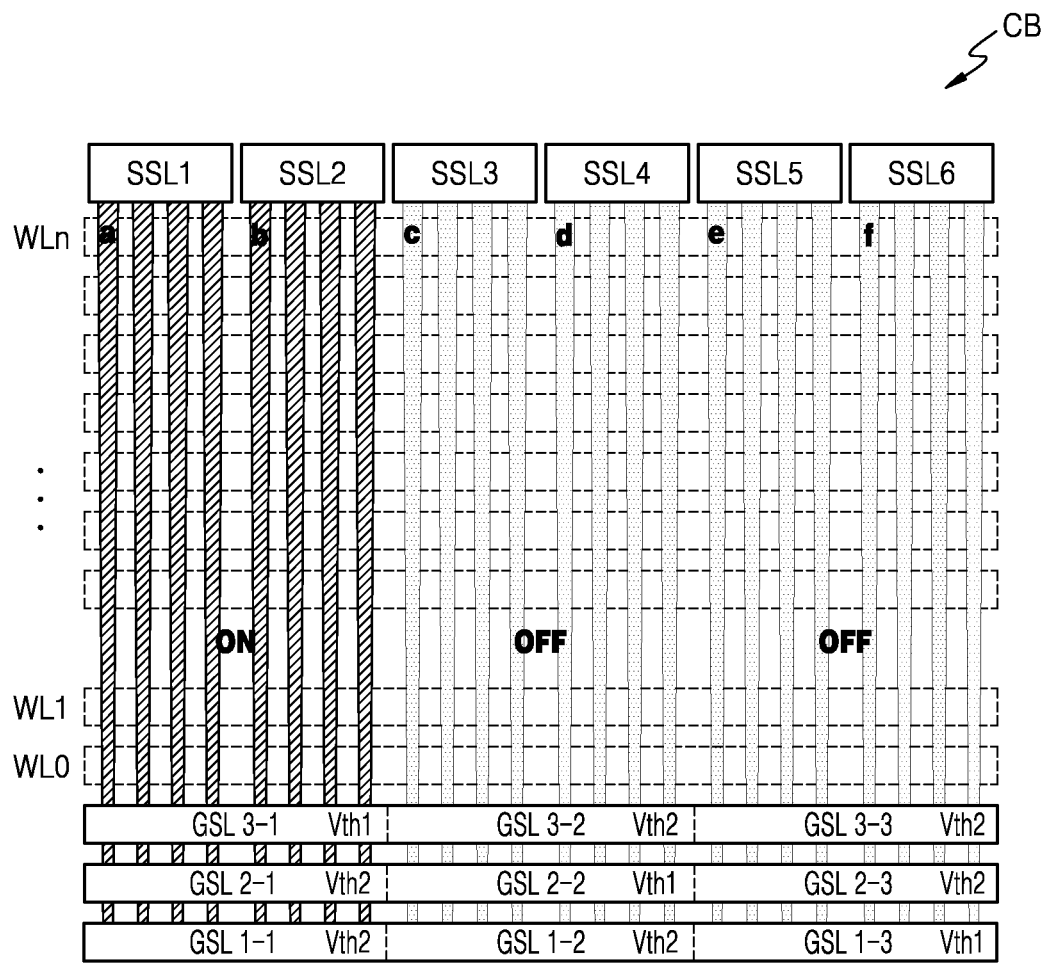

FIGS. 2A and 2B are cross-sectional views of a cell block having a GSL cut structure including a dummy hole and a cell block having a structure without a dummy hole, respectively.

FIG. 2A illustrates the case where a GSL cut is used to physically separate GSLs from each other. To form the GSL cut, at least one dummy hole may be arranged in a cell block CB. According to one or more embodiments, first to sixth string select lines SSL1 to SSL6 are illustrated in FIG. 2A. Because the first to sixth string select lines SSL1 to SSL6 are physically separated from each other, string select transistors connected to the first to sixth string select lines SSL1 to SSL6 may be separately controlled from each other. As illustrated in FIG. 2A, a series of word lines WL0-WLn are provided.

A GSL may be provided in common for at least one string select line. In one or more embodiments, a first ground select line GSL1 may be provided for the first to third string select lines SSL1 to SSL3, and a second ground select line GSL2 may be provided for the fourth to sixth string select lines SSL4 to SSL6. When the first string select line SSL1 is selected, ground select transistors connected to the first ground select line GSL1 may be turned on, and ground select transistors connected to the second ground select line GSL2 may be turned off.

A plurality of cell strings may be connected to each of the first to sixth string select lines SSL1 to SSL6. Cell strings (e.g., cell strings "a" to "f") connected to the first to sixth string select lines SSL1 to SSL6 may be connected in common to one bit line. For example, when the cell string "a" among the cell strings "a" to "f" of the first to sixth string select lines SSL1 to SSL6 is selected, a string select transistor connected to the first string select line SSL1 may be turned on, and accordingly, the cell string "a" may be electrically connected to the bit line while the other cell strings may be electrically disconnected from the bit line.

As the ground select transistors connected to the first ground select line GSL1 are turned on, respective ground select transistors of unselected cell strings (e.g., the cell strings "b" and "c") may also be turned on. For example, GSL1 may have a ground select transistor for each of cell strings "a", "b", and "c". However, because the string select transistors of the unselected cell strings "b" and "c" are turned off, as described above, programming or reading may be prevented from being performed on the unselected cell strings "b" and "c".

To improve the memory operating characteristics, such as programming and reading, of the cell block CB, in one or more examples, ground select lines may be physically separated with respect to the first to sixth string select lines SSL1 to SSL6. Accordingly, additional dummy holes may be arranged in the cell block CB while the first ground select line GSL1 and the second ground select line GSL2 are physically separated by one dummy hole in FIG. 2A. For example, when two dummy holes are arranged in the cell block CB, three GSLs physically separated from each other may be provided for the first to sixth string select lines SSL1 to SSL6. When GSLs are separated from each other with respect to the first to sixth string select lines SSL1 to SSL6, six GSLs physically separated from each other may be provided with respect to the first to sixth string select lines SSL1 to SSL6, respectively. However, as described above, when the number of dummy holes increases, the integration density of the cell block CB may decrease. As understood by one of ordinary skill in the art, the integration density of a cell block may correspond to the number of components included in the cell block excluding dummy components.

FIG. 2B illustrates the case where a dummy hole is removed to increase the integration density of the cell block CB. When a GSL cut is not used, a plurality of GSLs may be vertically arranged in the cell block CB. FIG. 2B illustrates the case where first to third ground select lines GSL1 to GSL3 are vertically arranged for the first to sixth string select lines SSL1 to SSL6. Although FIG. 2B illustrates that the first ground select line GSL1 is divided into three portions by dashed lines, this illustration is just for convenience of description. Each of the first to third ground select lines GSL1 to GSL3 may be provided in common for the first to sixth string select lines SSL1 to SSL6.

In the embodiment of FIG. 2B, ground select transistors connected to each of the first to third ground select lines GSL1 to GSL3 may be programmed to different threshold voltages with respect to the first to sixth string select lines SSL1 to SSL6. For example, each GSL may include one portion that is programmed with a different threshold voltage than the other portions of a respective GSL. For example, with respect to the third ground select line GSL3, ground select transistors in a third first portion GSL3-1 corresponding to the first and second string select lines SSL1 and SSL2 may be programmed to a first threshold voltage Vth1. On the other hand, ground select transistors in a third second portion GSL3-2 corresponding to the third and fourth string select lines SSL3 and SSL4 and ground select transistors in a third portion GSL3-3 corresponding to the fifth and sixth string select lines SSL5 and SSL6 may be programmed to a second threshold voltage Vth2 that is higher than the first threshold voltage Vth1.

In one or more examples, with respect to the second ground select line GSL2, ground select transistors in a second portion GSL2-2 corresponding to the third and fourth string select lines SSL3 and SSL4 may be programmed to the first threshold voltage Vth1. On the other hand, ground select transistors in a second first portion GSL2-1 corresponding to the first and second string select lines SSL1 and SSL2 and ground select transistors in a second third portion GSL2-3 corresponding to the fifth and sixth string select lines SSL5 and SSL6 may be programmed to the second threshold voltage Vth2. With respect to the first ground select line GSL1, ground select transistors in a first third portion GSL1-3 corresponding to the fifth and sixth string select lines SSL5 and SSL6 may be programmed to the first threshold voltage Vth1 while ground select transistors in a first portion GSL1-1 corresponding to the first and second string select lines SSL1 and SSL2 and ground select transistors in a first second portion GSL1-2 corresponding to the third and fourth string select lines SSL3 and SSL4 may be programmed to the second threshold voltage Vth2.

As described above, programming a GSL region to a threshold voltage may be referred to as GSL region coding. In the embodiment of FIG. 2B, although one GSL is provided at each height (or level) with respect to the first to sixth string select lines SSL1 to SSL6, the GSL may be electrically separated with respect to the first to sixth string select lines SSL1 to SSL6 according to the GSL region coding. For example, when one of the first and second string select lines SSL1 and SSL2 is selected, a ground selection voltage having a level between the first threshold voltage Vth1 and the second threshold voltage Vth2 may be provided to the third ground select line GSL3, and accordingly, ground select transistors in the third first portion GSL3-1 may be turned on, and ground select transistors in the third second portion GSL3-2 and ground select transistors in the third portion GSL3-3 may be turned off. As a result, based on this configuration, cell strings of at least the third to sixth string select lines SSL3 to SSL6 may be electrically separated from a common source line. According to the driving method described above, the third ground select line GSL3 may be defined as having an electrically separated structure with respect to the first to sixth string select lines SSL1 to SSL6.

According to the electrically separated structure, when one of the third and fourth string select lines SSL3 and SSL4 is selected, a ground selection voltage having a level between the first threshold voltage Vth1 and the second threshold voltage Vth2 may be provided to the second ground select line GSL2, and accordingly, ground select transistors in the second portion GSL2-1 may be turned on, and ground select transistors in the second first portion GSL2-1 and ground select transistors in the second third portion GSL2-3 may be turned off. When one of the fifth and sixth string select lines SSL5 and SSL6 is selected, a ground selection voltage having a level between the first threshold voltage Vth1 and the second threshold voltage Vth2 may be provided to the first ground select line GSL1, and accordingly, ground select transistors in the first third portion GSL1-3 may be turned on, and ground select transistors in the first portion GSL1-1 and ground select transistors in the first second portion GSL1-2 may be turned off. As a result of this configuration, one or more SSLs may be turned on while the other SSLs remain turned off without decreasing the integration density with dummy holes.

According to the structure of FIG. 2B, a plurality of ground select transistors may be vertically arranged in a cell string and may be between a word line (e.g., WL0) and a common source line adjacent to a substrate. In this case, all ground select transistors of a selected cell string may be turned on, and at least one of the ground select transistors of an unselected cell string may be turned off.

FIG. 2B illustrates the case where three GSLs are arranged for the first to sixth string select lines SSL1 to SSL6 and each GSL is separated in units of two string select lines. However, as understood by one of ordinary skill in the art, the electrical separation may be implemented in various manners. For example, various numbers of GSLs may be provided in the cell block CB. For example, when two GSLs are arranged in the cell block CB, a GSL may be electrically separated in units of three string select lines. In one or more examples, when six GSLs are arranged in the cell block CB, a GSL may be electrically separated in units of one string select line. When a GSL is electrically separated in units of one string select line, only a ground select transistor of a selected cell string among a plurality of cell strings connected in common to a GSL may be turned on, and the ground select transistors of the other unselected cell strings may be turned off. In this case, an electrical separation characteristic may be advantageously improved.

Although it has been described with reference to FIG. 2B that ground select transistors in a GSL region are programmed to the first threshold voltage Vth1 or the second threshold voltage Vth2, embodiments are not limited thereto. For example, the first threshold voltage Vth1 may correspond to a voltage in an erase state. In this case, a program operation may not be performed on a ground select transistor having the first threshold voltage Vth1.

Figure 2C:
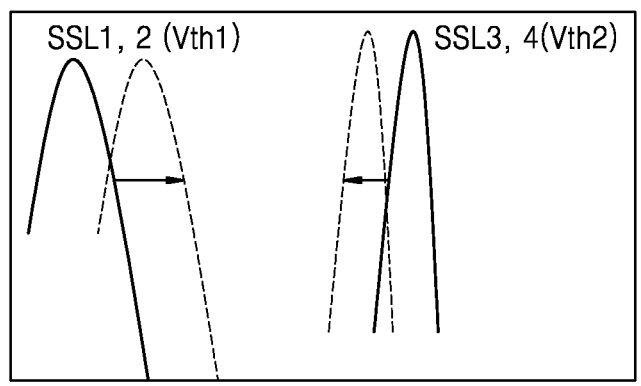
FIG. 2C illustrates the case where a threshold voltage distribution of ground select transistors is changed according to one or more embodiments.

FIG. 2C illustrates the case where a threshold voltage distribution of ground select transistors is changed. For example, FIG. 2C illustrates the shift of the threshold voltage distribution of ground select transistors, which correspond to each of the first and second string select lines SSL1 and SSL2 and are programmed to the first threshold voltage Vth1, among ground select transistors connected to the third ground select line GSL3 in FIG. 2B. FIG. 2C further illustrates the shift of the threshold voltage distribution of ground select transistors, which correspond to each of the third and fourth string select lines SSL3 and SSL4 and are programmed to the second threshold voltage Vth2, among the ground select transistors connected to the third ground select line GSL3 in FIG. 2B.

Each of the ground select transistors of the cell block CB may be interfered with a program or read operation of adjacent transistors (e.g., transistors adjacent to each ground select transistor in a vertical direction may cause noise that interferes with a cell block CB), and a relatively low threshold voltage level of a ground select transistor may be increased by the interference. A relatively high threshold voltage level of a ground select transistor may be decreased by leakage of charge or any other factors known to one of ordinary skill in the art that cause a decrease in threshold voltage. For example, as shown in FIG. 2C, when the gap between ground select transistors programmed to the first threshold voltage Vth1 and ground select transistors programmed to the second threshold voltage Vth2 decreases, the electrical separation characteristic of GSLs may be degraded, which may increase the possibility of losing important information stored in the cell block CB. Consequently, data reliability may be degraded.

Figure 3A:
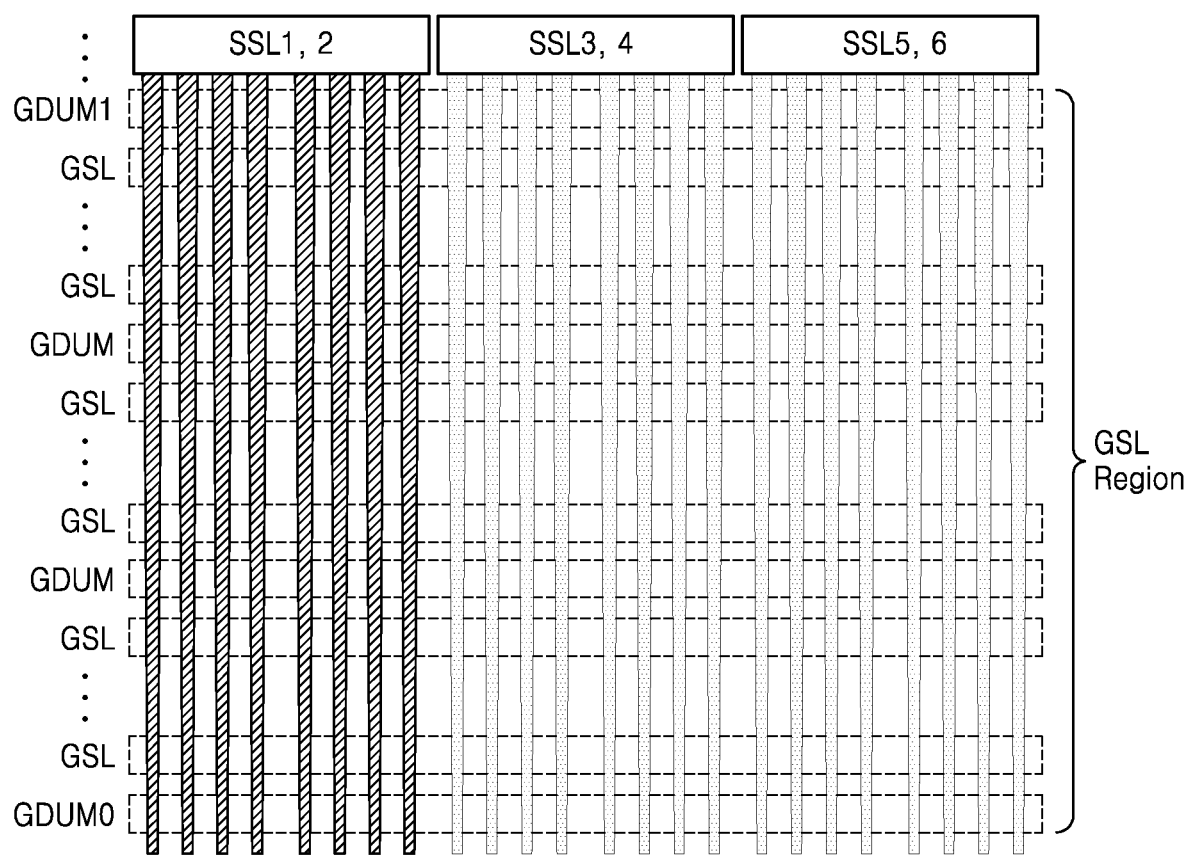
FIGS. 3A and 3B are diagrams of an example implementation of a cell block according one or more embodiments.
Figure 3B:
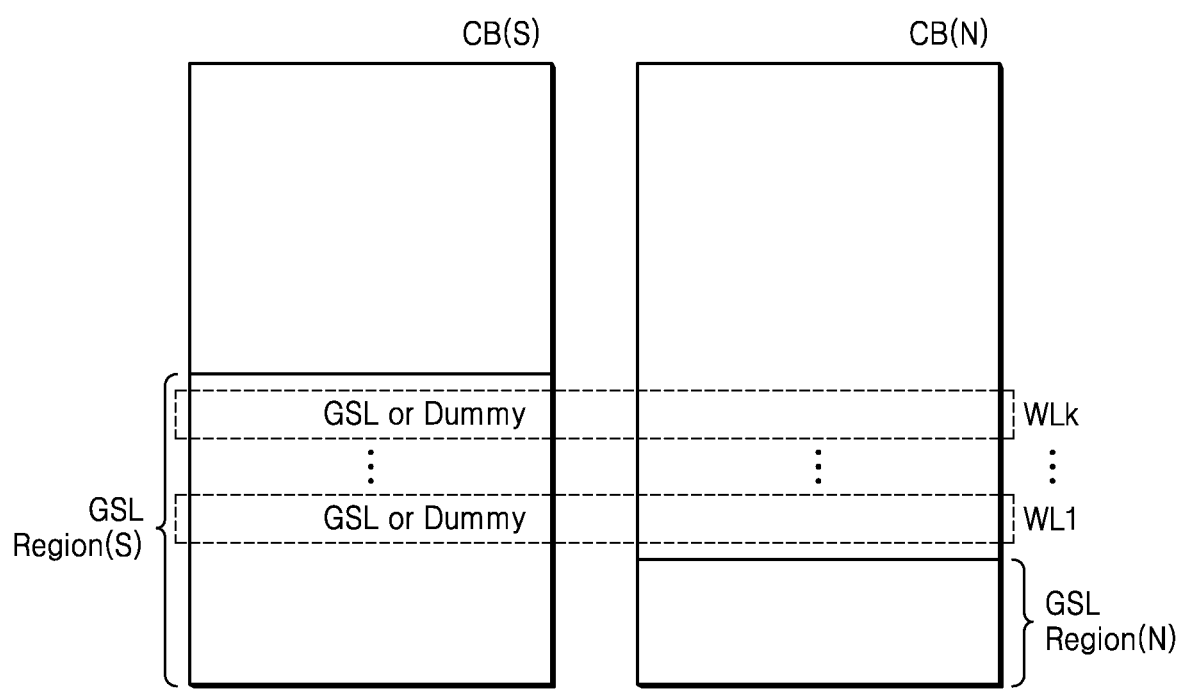

FIGS. 3A and 3B are diagrams of an example implementation of a cell block according one or more embodiments. FIGS. 3A and 3B illustrate an example implementation of a GSL region of a special cell block, according to one or more embodiments.

Referring to FIG. 3A, the GSL region of the special cell block may include a plurality of dummy lines and a plurality of GSLs. Dummy cells may be connected to each dummy line, and ground select transistors may be connected to each GSL. The number of dummy lines and/or GSLs in the GSL region of the special block may be different from the number of dummy lines and/or GSLs in the GSL region of a normal cell block. The threshold voltage of dummy cells and/or ground select transistors in the GSL region of the special cell block may be programmed to a different value than that of a normal cell block.

In an example implementation, FIG. 3A illustrates the case where electrical separation is applied among a first group of string select lines including the first and second string select lines SSL1 and SSL2, a second group of string select lines including the third and fourth string select lines SSL3 and SSL4, and a third group of string select lines including the fifth and sixth string select lines SSL5 and SSL6. To implement electrical separation with respect to a plurality of string selection lines, a plurality of GSLs may be arranged in the GSL region.

For example, a first dummy line GDUM0 may be arranged in the GSL region to be adjacent to a common source line, and a second dummy line GDUM1 may be arranged in the GSL region to be adjacent to a word line. Assuming that a common source line is in the bottom of the vertical structure of a cell block, the GSL region may include the first dummy line GDUM0 at the bottom thereof and the second dummy line GDUM1 at the top thereof. In the GSL region, one or more dummy lines GDUM and a plurality of GSLs may be arranged between the first dummy line GDUM0 and the second dummy line GDUM1.

In one or more embodiments, when the threshold voltage of ground select transistors connected to a GSL is programmed, some of the ground select transistors may be programmed to a different threshold voltage than the other ground select transistors. For example, with respect to one GSL, ground select transistors corresponding to the first and second string select lines SSL1 and SSL2 may be programmed to a first threshold voltage while ground select transistors corresponding to the third to sixth string select lines SSL3 to SSL6 may be programmed to a second threshold voltage that is higher than the first threshold voltage. Accordingly, when the first and second string select lines SSL1 and SSL2 are electrically separated from the third to sixth string select lines SSL3 to SSL6 in a memory operation, such as a data program or read operation, a voltage having a level between the first threshold voltage and the second threshold voltage may be provided to a GSL, and therefore, a control operation may be performed such that the ground select transistors corresponding to the first and second string select lines SSL1 and SSL2 are turned on while the ground select transistors corresponding to the third to sixth string select lines SSL3 to SSL6 are turned off, thereby increasing data reliability.

Referring to FIG. 3B, a memory device According to one or more embodiments may include a special cell block CB(S), which stores information other than user data, and a normal cell block CB(N), which stores the user data. A plurality of lines may be vertically arranged in each of the special cell block CB(S) and the normal cell block CB(N). In one or more embodiments, the lines may be referred to as word lines. The word lines may be referred to as GSLs or dummy lines, which are arranged in a GSL region according to the functions or purposes thereof. The word lines may be referred to as normal word lines connected to memory cells storing user data.

According to one or more embodiments, because a GSL region is configured in the special cell block CB(S) and a plurality of GSLs and dummy lines programmed to a certain threshold voltage are arranged in the GSL region, more GSLs may be advantageously arranged in the special cell block CB(S) than in the normal cell block CB(N). Accordingly, regarding one or more lines WL1 to WLk at the same heights between the special cell block CB(S) and the normal cell block CB(N), the lines WL1 to WLk in the special cell block CB(S) may correspond to GSLs or dummy lines while the lines WL1 to WLk in the normal cell block CB(N) may correspond to word lines, or normal word lines, connected to memory cells storing user data.

In one or more examples, based on the configuration of the special cell block CB(S) and the normal cell block CB(N) as described above, the lines WL1 to WLk may be differently controlled with respect to the special cell block CB(S) and the normal cell block CB(N) during a program, read, or erase operation at the same height. For example, in a read operation, a voltage having a level according to coding of the GSL region may be provided to the lines WL1 to WLk of the special cell block CB(S) while a read voltage according to a program state of a memory cell or a pass voltage for passing the memory cell may be provided to the lines WL1 to WLk of the normal cell block CB(N). In one or more examples, in a program operation, a voltage for coding the GSL region may be provided to the lines WL1 to WLk of the special cell block CB(S) while a voltage having a level according to a bit value of user data may be provided to the lines WL1 to WLk of the normal cell block CB(N).

FIG. 3B illustrates the case where a GSL region is also provided in the normal cell block CB(N), and the GSL region of the normal cell block CB(N) may be implemented as shown in FIG. 2B. According to one or more embodiments, the normal cell block CB(N) may not include a GSL region to which programming is applied. In this case, the normal cell block CB(N) may include one or more normal GSLs.

Figure 4:
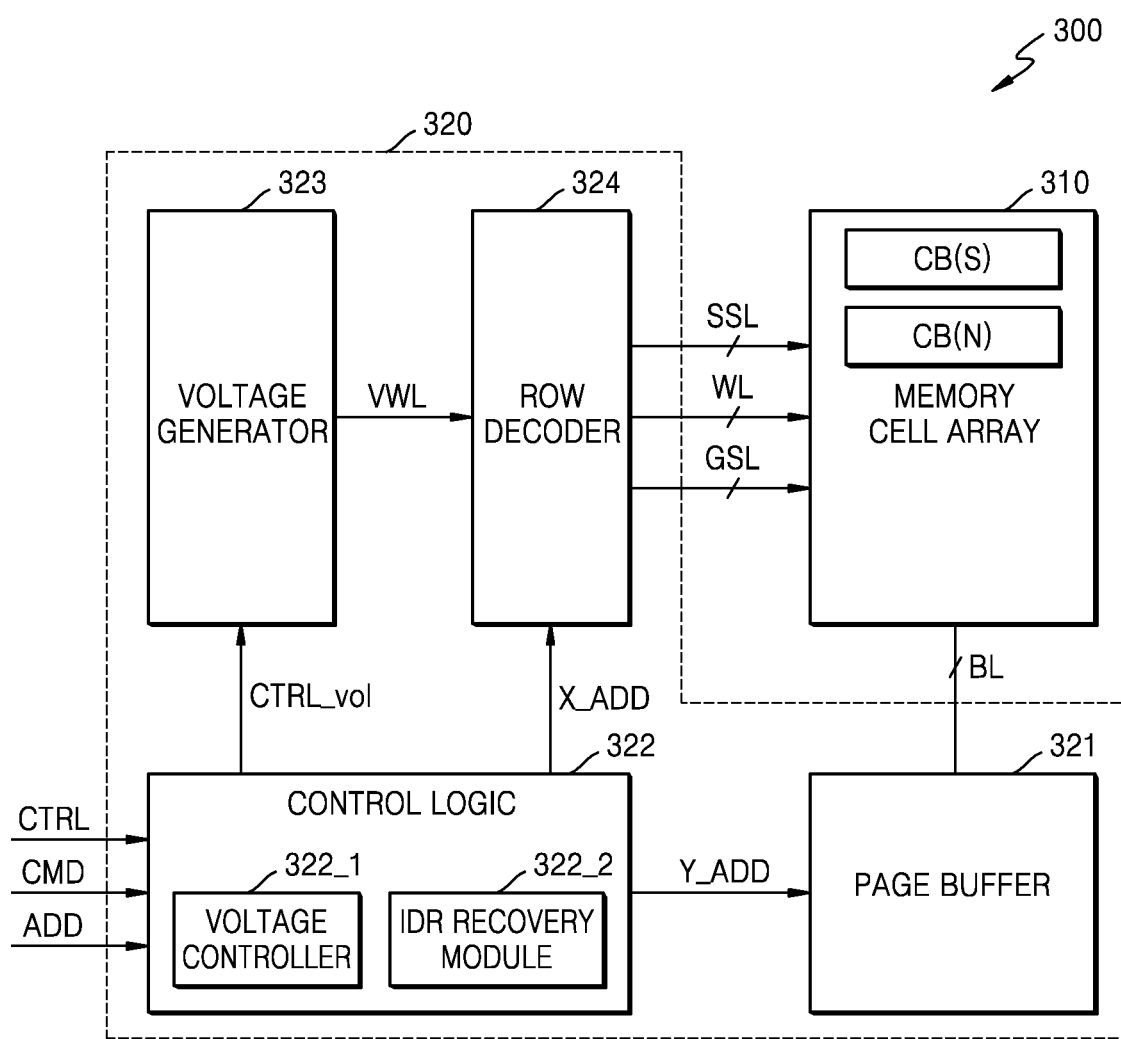
FIG. 4 is a block diagram of a memory device according to one or more embodiments.

FIG. 4 is a block diagram of a memory device according to one or more embodiments.

Referring to FIG. 4, a memory device 300 may include a memory cell array 310 and a peripheral circuit 320. The peripheral circuit 320 may include a page buffer 321, a control logic 322, a voltage generator 323, and a row decoder 324. In one or more examples, the peripheral circuit 320 may further include various elements, such as a data input/output (I/O) circuit and an I/O interface.

The memory cell array 310 may be connected to the page buffer 321 through bit lines BL and connected to the row decoder 324 through word lines WL, string select lines SSL, and ground select lines GSL. The memory cell array 310 may include a plurality of cell blocks, where each of the cell blocks may include a plurality of cell strings. The cell blocks of the memory cell array 310 may include at least one special cell block CB(S) and at least one normal cell block CB(N).

The control logic 322 may output various control signals (e.g., a voltage control signal CTRL_vol, a row address X-ADD, and a column address Y-ADD) for programming/writing data to or reading data from the memory cell array 310, based on a command CMD, an address ADD, and a control signal CTRL. The control logic 322 may include a voltage controller 322_1 which adjusts the level of a voltage generated by the voltage generator 323. When the special cell block CB(S) stores IDR data, the control logic 322 may also include an IDR recovery module 322_2. The IDR recovery module 3222 may recover IDR data when a failure occurs in the IDR data. Although FIG. 4 illustrates that the voltage controller 322_1 and the IDR recovery module 322_2 are included in the control logic 322, the voltage controller 322_1 and/or the IDR recovery module 3222 may be outside of the control logic 322, as understood by one of ordinary skill in the art.

The voltage generator 323 may generate various voltages for performing program, read, and erase operations on the memory cell array 310 based on the voltage control signal CTRL_vol. Although FIG. 4 illustrates that the voltage generator 323 generates a word line voltage VWL, the word line voltage VWL may include a voltage provided to the word lines WL of the memory cell array 310, a voltage provided to the string select lines SSL, and a voltage provided to the ground select lines GSL.

According to one or more embodiments, the special cell block CB(S) may have a different structure or configuration than the normal cell block CB(N). For example, the special cell block CB(S) and the normal cell block CB(N) may include the same number of lines connected to the row decoder 324, however, the GSL region of the special cell block CB(S) may have more dummy lines and/or GSLs compared to the normal cell block CB(N). Accordingly, the number of word lines WL connected to memory cells storing data or information in the special cell block CB(S) may be less than the number of word lines WL of the normal cell block CB(N). For example, the number of memory cells storing data or information in the special cell block CB(S) (or the capacity of the special cell block CB(S)) may be less than that in the normal cell block CB(N).

The voltage controller 322_1 may control a voltage level for the coding of a GSL region of each of the special cell block CB(S) and the normal cell block CB(N). For example, under control by the voltage controller 322_1, a program operation may be performed such that the level of the threshold voltage of ground select transistors of the special cell block CB(S) is different from the level of the threshold voltage of ground select transistors of the normal cell block CB(N). The voltage controller 322_1 may control an operation of adjusting a threshold voltage level for dummy cells of the special cell block CB(S).

In one or more examples, the IDR recovery module 322_2 may receive IDR data read from the special cell block CB(S) and perform a recovery operation to recover the IDR data in case of an IDR data read fail. In one or more examples, replica IDR data generated from IDR data may also be stored in the special cell block CB(S) together with the IDR data, and the IDR data may be recovered by executing a recovery algorithm using the IDR data and the replica IDR data.

Figure 5:
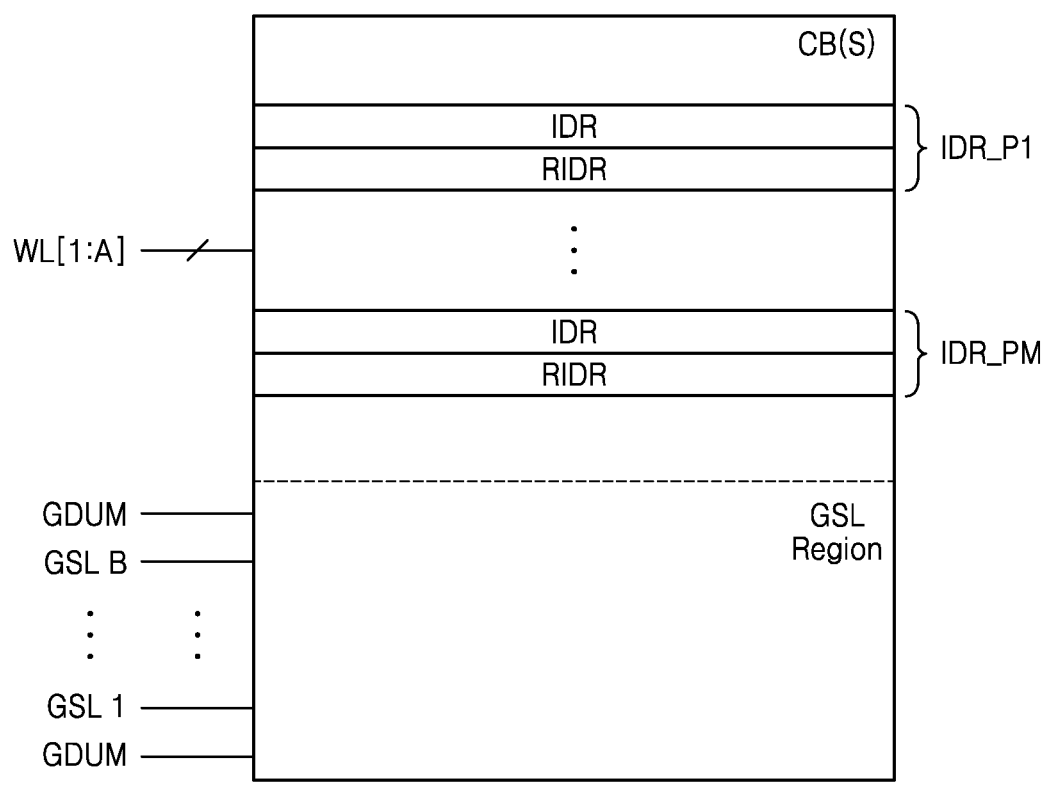
FIG. 5 is a block diagram of an example implementation of a special cell block storing information data read (IDR) data according to one or more embodiments.

FIG. 5 is a block diagram of an example configuration of a special cell block storing IDR data. The IDR data may include information, such as DC information, option information, repair information, and bad block information, which are necessary to initialize a memory system or a memory device, or any other suitable information known to one of ordinary skill in the art.

Referring to FIG. 5, the special cell block CB(S) may include a region storing information and a GSL region, and IDR data IDR may be stored in the region storing information. In one or more embodiments, replica IDR data RIDR corresponding to the IDR data IDR may also be stored in the special cell block CB(S), and the IDR data IDR and the replica IDR data RIDR may constitute an IDR pair. In an example implementation, the replica IDR data RIDR may have an inverted bit value of the IDR data IDR. In one or more examples, a plurality of (e.g., M) IDR pairs IDR_P1 to IDR_PM may be stored in the special cell block CB(S).

According to the embodiments described above, one or more dummy lines GDUM and a plurality of GSLs may be arranged in the GSL region of the special cell block CB(S). FIG. 5 illustrates the case where first to A-th word lines WL[1:A] and first to B-th ground select lines GSL1 to GSLB are arranged in the special cell block CB(S). To electrically separate each of the first to B-th ground select lines GSL1 to GSLB with respect to a plurality of string select lines, ground select transistors connected to each of the first to B-th ground select lines GSL1 to GSLB may be programmed to various threshold voltages. For example, as described above, one or more of ground select transistors connected to a GSL may be programmed to a first threshold voltage while the remaining ground select transistors may be programmed to a second threshold voltage that is higher than the first threshold voltage.

The electrical separation characteristics of the first to B-th ground select lines GSL1 to GSLB may be different according to the number of first to B-th ground select lines GSL1 to GSLB arranged in the special cell block CB(S). For example, as the number of first to B-th ground select lines GSL1 to GSLB increases, the number of portions into which each GSL is electrically separated may increase. As the number of first to B-th ground select lines GSL1 to GSLB decreases, the electrical separation characteristic of each GSL may decrease. In one or more examples, when the number of string select lines of the special cell block CB(S) is the same as the number of first to B-th ground select lines GSL1 to GSLB, the first to B-th ground select lines GSL1 to GSLB may be electrically separated from each other with respect to the string select lines.

When electrical separation is applied to a GSL, an algorithm for correcting an error may be executed to increase the reliability of data and information. However, because IDR data includes information necessary for initialization of a memory device, an error correction algorithm may not be executed when an error occurs in the special cell block CB(S) storing the IDR data. However, according to one or more embodiments, based on the above described configurations, the reliability of the special cell block CB(S) may be increased, and the possibility of error occurrence in important information read from the special cell block CB(S) may be decreased.

Figure 6:
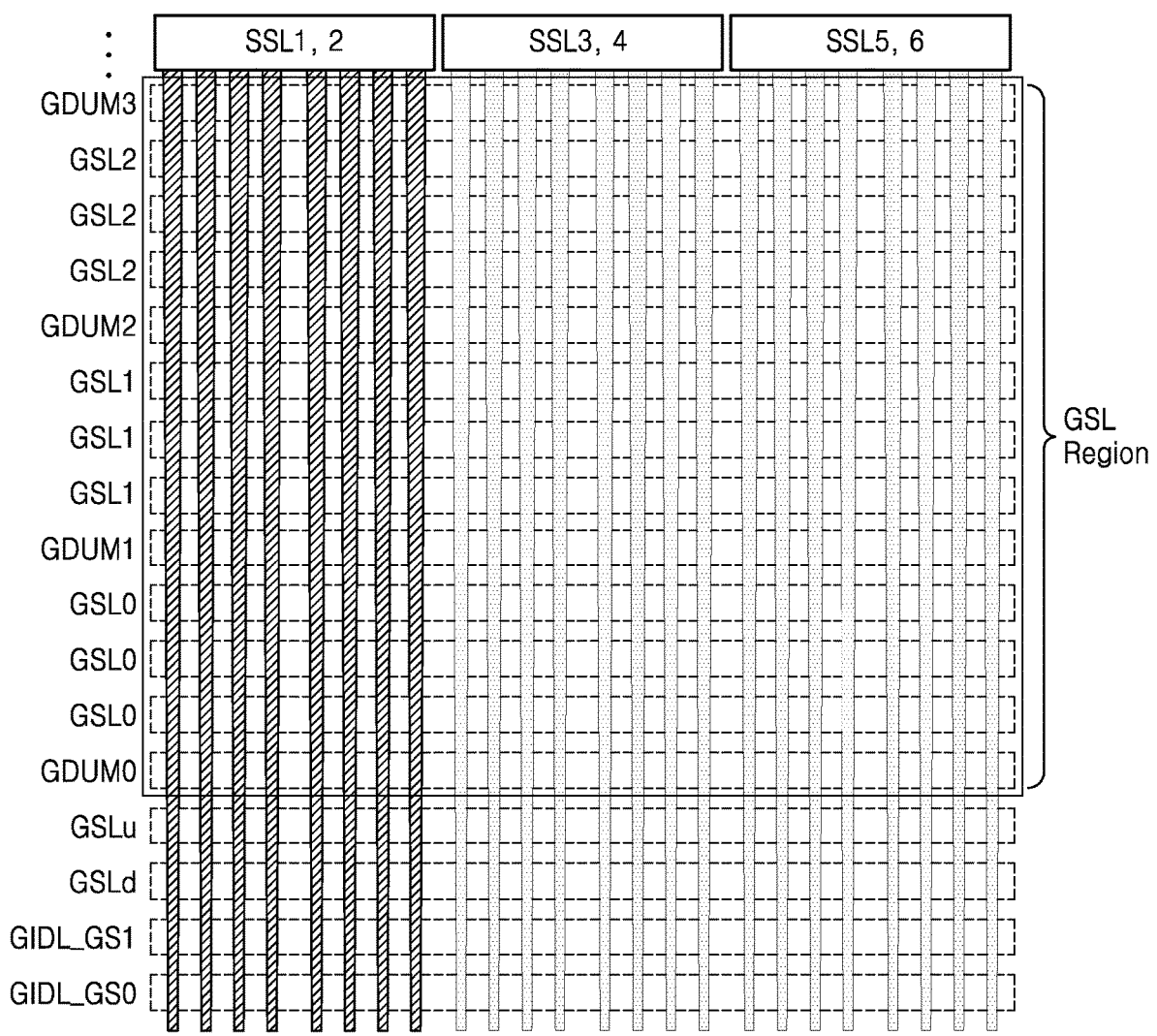
FIG. 6 is a diagram of a specific implementation of a special cell block, according to one or more embodiments.

FIG. 6 is a diagram of a special cell block, according to one or more embodiments. FIG. 6 illustrates the case where a cell block includes the first to sixth string select lines SSL1 to SSL6 and a GSL is electrically separated into three portions. In other words, one or more embodiments in which the first to sixth string select lines SSL1 to SSL6 are classified into three groups is applied.

Referring to FIG. 6, the GSL region of a special cell block may include a plurality of GSLs. For example, first to third ground select lines GSL0 to GSL2 may be arranged in the GSL region. The first to third ground select lines GSL0 to GSL2 may have different electrical separation characteristics from each other. For example, the first ground select line GSL0 may have an electrical separation characteristic between the first and second string select lines SSL1 and SSL2 that is different than the electrical separation characteristics of the other string select lines. The second ground select line GSL1 may have an electrical separation characteristic between the third and fourth string select lines SSL3 and SSL4 that is different than the electrical separation characteristics of the other string select lines. The third ground select line GSL2 may have an electrical separation characteristic between the fifth and sixth string select lines SSL5 and SSL6 that is different than the electrical separation characteristics of the other string select lines.

According to one or more embodiments, a plurality of first ground select lines GSL0, second ground select lines GSL1, and third ground select lines GSL2 may be arranged in the special cell block of FIG. 6. For example, three first ground select lines GSL0 may be arranged in the special cell block, and ground select transistors connected to the three first ground select lines GSL0 may be programmed to the same threshold voltage. Accordingly, based on this configuration, even when the electrical separation characteristic of one of the three first ground select lines GSL0 is degraded, the electrical separation characteristic of the other first ground select lines GSL0 may be advantageously maintained.

In one or more examples, a plurality of first ground select lines GSL0 may be arranged between a first dummy line GDUM0, which is adjacent to a common source line, and a second dummy line GDUM1 above the first dummy line GDUM0. A plurality of second ground select lines GSL1 may be arranged between the second dummy line GDUM1 and a third dummy line GDUM2 thereabove, and a plurality of third ground select lines GSL2 may be arranged between the third dummy line GDUM2 and a fourth dummy line GDUM3 thereabove. Although FIG. 6 illustrates that three of each of the first to third ground select lines GSL0 to GSL2 are arranged in the GSL region, at least two lines may be arranged in the GSL region.

According to the GSL region coding described above, when a cell string connected to the first string select line SSL1 or the second string select line SSL2 is selected, a ground selection voltage having a level between the first threshold voltage and the second threshold voltage may be provided to the first ground select lines GSL0. Accordingly, first ground select transistors arranged in correspondence to the first and second string select lines SSL1 and SSL2 may be turned on while first ground select transistors arranged in correspondence to the third to sixth string select lines SSL3 to SSL6 may be turned off. Accordingly, when the cell string connected to the first string select line SSL1 or the second string select line SSL2 is selected, the cell strings connected to the unselected third to sixth string select lines SSL3 to SSL6 may be electrically disconnected from the common source line.

Referring to FIG. 6, additional lines may be further arranged in the special cell block that are not included in a normal cell block. For example, the special cell block may further include one or more ground select lines GSLu and GSLd and one or more erase control lines GIDL_GS0 and GIDL_GS1. The GSL region coding described above may not be applied to the ground select lines GSLu and GSLd. Ground select transistors connected to the ground select lines GSLu and GSLd may not be programmed or may be programmed to the same threshold voltage with respect to the first to sixth string select lines SSL1 to SSL6. The erase control lines GIDL_GS0 and GIDL_GS1 may be provided to improve the erase characteristic of a cell block by generating gate induced drain leakage (GIDL). For example, an erase voltage may be provided to a channel through transistors connected to the erase control lines GIDL_GS0 and GIDL_GS1.

In one or more embodiments, a dummy line may be omitted from the GSL region in FIG. 6. For example, regarding the first ground select lines GSL0, a plurality of ground select transistors of same cell string may have the same level of threshold voltages. Accordingly, the amount of interference exerted on ground select transistors, which may be located in the middle among the ground select transistors of the same cell string, by adjacent transistors may be slight, and therefore, an electrical separation characteristic may be advantageously secured.

Figure 7:
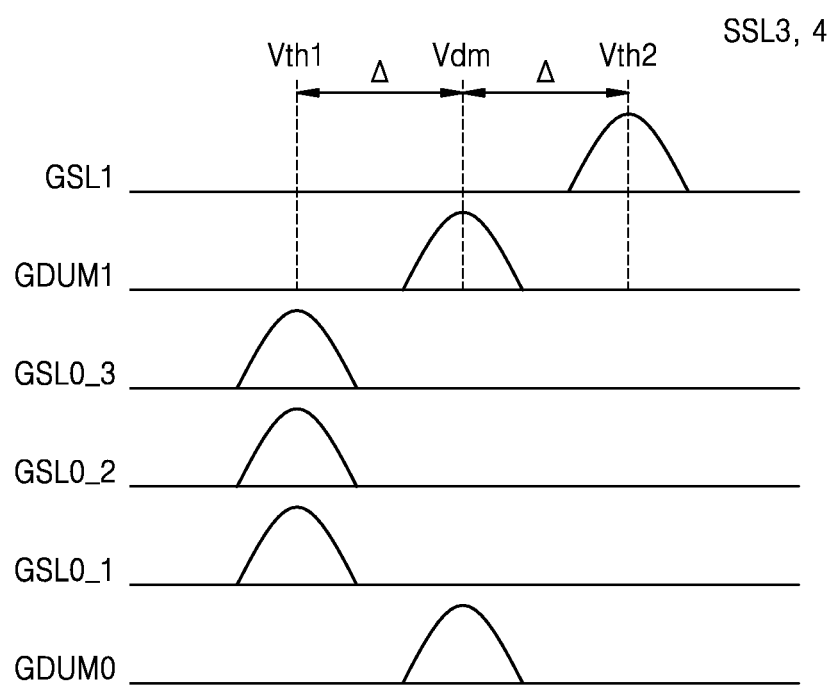
FIG. 7 is a diagram illustrating threshold voltage distribution characteristics according to the coding of a GSL region in FIG. 6 according to one or more embodiments.

FIG. 7 is a diagram illustrating threshold voltage distribution characteristics according to the coding of the GSL region in FIG. 6 according to one or more embodiments. FIG. 7 shows an example of threshold voltage distributions of dummy cells and ground select transistors, which correspond to each of the third and fourth string select lines SSL3 and SSL4. FIG. 7 illustrates the case where first ground select transistors connected to the first ground select lines GSL0 among the first to third ground select lines GSL0 to GSL2 corresponding to each of the third and fourth string select lines SSL3 and SSL4 are programmed to the first threshold voltage Vth1, and second and third ground select transistors connected to the other second and third ground select lines GSL1 and GSL2 are programmed to the second threshold voltage Vth2.

Referring to FIG. 7, as first ground select transistors corresponding to each of the third and fourth string select lines SSL3 and SSL4 are programmed to the first threshold voltage Vth1, first ground select transistors corresponding to each of the other first, second, fifth, and sixth string select lines SSL1, SSL2, SSL5, and SSL6 may be programmed to the second threshold voltage Vth2. When a cell string connected to the third string select line SSL3 or the fourth string select line SSL4 is selected, a voltage having a level between the first threshold voltage Vth1 and the second threshold voltage Vth2 may be applied to the first ground select lines GSL0, and accordingly, the first ground select transistors corresponding to each of the third and fourth string select lines SSL3 and SSL4 may be turned on while the first ground select transistors corresponding to each of the remaining first, second, fifth, and sixth string select lines SSL1, SSL2, SSL5, and SSL6 may be turned off. As a result of this configuration, cell strings connected to the third and fourth string select lines SSL3 and SSL4 may be electrically separated from cell strings connected to the first, second, fifth, and sixth string select lines SSL1, SSL2, SSL5, and SSL6.

Dummy cells connected to the first dummy line GDUM0 and the second dummy line GDUM1 may have a certain threshold voltage Vdm. For example, the threshold voltage Vdm of the dummy cells may have a level between the threshold voltage of the first ground select lines GSL0 and the threshold voltage of the second ground select lines GSL1 located above the first ground select lines GSL0. For example, as the first ground select lines GSL0 have the first threshold voltage Vth1 and the second ground select lines GSL1 have the second threshold voltage Vth2, the dummy cells connected to the first dummy line GDUM0 and the second dummy line GDUM1 may have a voltage level between the first threshold voltage Vth1 and the second threshold voltage Vth2.

According to the GSL region coding described above, as the first ground select lines GSL0 are adjacent to the second dummy line GDUM1, the level difference between the threshold voltage of the first ground select transistors and the threshold voltage of transistors of a line adjacent to the first ground select transistors may decrease, and the amount of interference exerted on the first ground select transistors by programming adjacent lines may reduce. For example, compared to the case where the first ground select lines GSL0 second ground select lines GSL1, the amount of shift of the threshold voltage of the first ground select transistors to the right due to interference may reduce, and accordingly, a margin securing characteristic between the first threshold voltage Vth1 and the second threshold voltage Vth2 may be improved. Accordingly, an electrical separation characteristic between cell strings connected to the third and fourth string select lines SSL3 and SSL4 and cell strings connected to the first, second, fifth, and sixth string select lines SSL1, SSL2, SSL5, and SSL6 may be improved.

Although FIG. 7 illustrates the case where dummy cells connected to the first dummy line GDUM0 and the second dummy line GDUM1 are programmed to the same level of threshold voltages, as understood by one of ordinary skill in the art, the embodiments are not limited thereto. For example, transistors connected to the ground select lines GSLu and GSLd and the erase control lines GIDL_GS0 and GIDL_GS1 may be arranged further below the first ground select lines GSL0, and the threshold voltage of dummy cells connected to the first dummy line GDUM0 may be determined considering the threshold voltage level of transistors connected to the ground select lines GSLu and GSLd and the erase control lines GIDL_GS0 and GIDL_GS1.

Figure 8:
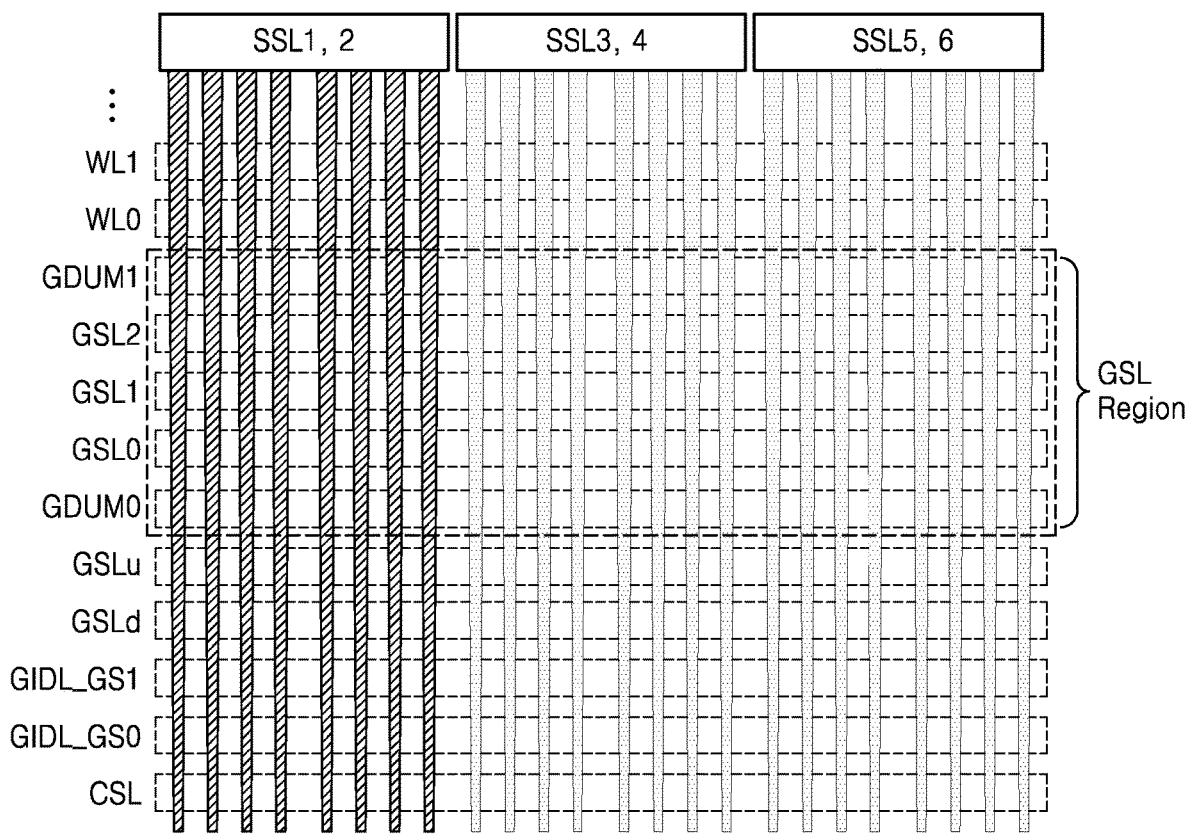
FIGS. 8 and 9 are diagrams respectively illustrating a specific implementation of a special cell block and a threshold voltage, according to some embodiments.
Figure 9:
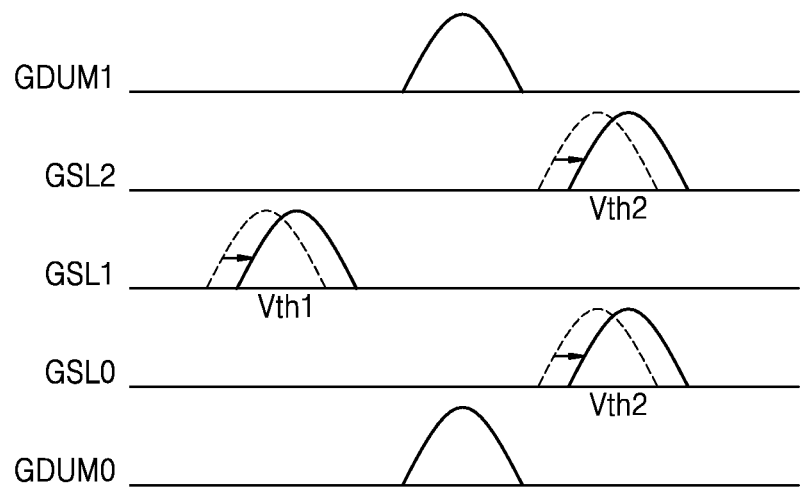

FIGS. 8 and 9 are diagrams respectively illustrating a special cell block and a threshold voltage, according to one or more embodiments.

Referring to FIG. 8, first to third ground select lines GSL0 to GSL2 may be arranged in the GSL region of the special cell block, and the first dummy line GDUM0 and the second dummy line GDUM1 may be arranged as at least one dummy line. In one or more embodiments, the first dummy line GDUM0 may be below the first ground select line GSL0, and the second dummy line GDUM1 may be between a word line WL0 and the third ground select line GSL2. In one or more embodiments, at least one line may be further arranged between the first ground select line GSL0 and a common source line. FIG. 8 illustrates the case where two ground select lines GSLu and GSLd and two erase control lines GIDL_GS0 and GIDL_GS1 are arranged between the first ground select line GSL0 and the common source line.

Each of the first to third ground select lines GSL0 to GSL2 may be programmed to have the threshold voltage described above. For example, referring to FIG. 9, second ground select transistors corresponding to each of the third and fourth string select lines SSL3 and SSL4 may be programmed to a first threshold voltage while second ground select transistors corresponding to each of the first, second, fifth, and sixth string select lines SSL1, SSL2, SSL5, and SSL6 may be programmed to a second threshold voltage. Furthermore, first ground select transistors corresponding to each of the third and fourth string select lines SSL3 and SSL4 and third ground select transistors corresponding to each of the third and fourth string select lines SSL3 and SSL4 may be programmed to the second threshold voltage. When a cell string connected to one of the first and second string select lines SSL1 and SSL2 is selected, a ground selection voltage provided to the second ground select line GSL1 may have a level between the first threshold voltage and the second threshold voltage.

As described above, dummy cells connected to each of the first dummy line GDUM0 and the second dummy line GDUM1 may be programmed to have a certain threshold voltage. For example, according to the embodiments described above, dummy cells connected to each of the first dummy line GDUM0 and the second dummy line GDUM1 may be programmed to have a level between the first threshold voltage and the second threshold voltage.

In the embodiment of FIG. 9, the threshold voltage distribution of ground select transistors connected to each of the first to third ground select lines GSL0 to GSL2 in a special cell block may shift to the right, compared to the threshold voltage distribution of ground select transistors in a normal cell block. For example, as shown by the dashed lines in FIG. 9, at least one of the first and second threshold voltages may be programmed to a higher level in the special cell block than in the normal cell block. In FIG. 9, the dashed line may correspond to the voltage threshold in a normal cell block, and the sold line may correspond to the voltage threshold in the special block.

High-temperature infrared (IR) light or heat may be applied to the memory device several times during the manufacture of a memory device. In this case, because of leakage of the charge of memory cells programmed with information, the threshold voltage of the memory cells may shift to the left. However, according to one or more embodiments, because the threshold voltage of ground select transistors of a special cell block is shifted to the right, compared to a normal cell block, degradation of the threshold voltage distribution by the high-temperature IR light and/or heat may be advantageously compensated for.

Furthermore, the distribution characteristic of ground select transistors programmed to the first threshold voltage is likely to deteriorate due to interference. According to one or more embodiments, because there is a dummy cell programmed to a level between the first threshold voltage and the second threshold voltage, the amount of interference exerted on the ground select transistors may advantageously decrease, and accordingly, an electrical separation characteristic between a selected cell string and unselected cell strings may be improved.

Figure 10:
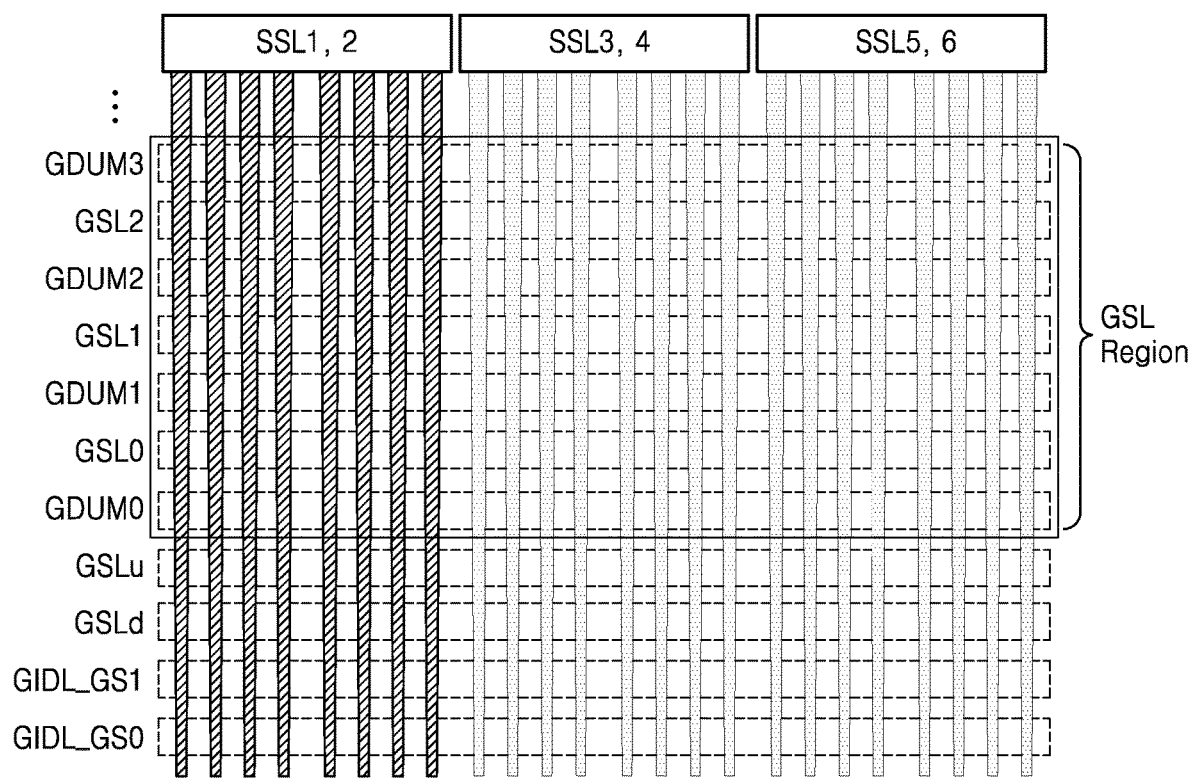
FIG. 10 is a diagram of a specific implementation of a special cell block, according to some embodiments.

FIG. 10 is a diagram of a specific implementation of a special cell block, according to some embodiments.

Referring to FIG. 10, the first to third ground select lines GSL0 to GSL2 may be arranged in the GSL region of the special cell block, and at least one dummy line may be arranged. FIG. 10 illustrates the case where there are more dummy lines than in the embodiment of FIG. 8. For example, a dummy line may be arranged at each of both sides of each of the first to third ground select lines GSL0 to GSL2 such that the GSL region includes first to fourth dummy lines GDUM0 to GDUM3.

Because a dummy line is arranged at each of both sides of each of the first to third ground select lines GSL0 to GSL2 and dummy cells connected to the dummy line is programmed to a threshold voltage having a level between the first threshold voltage and the second threshold voltage, interference exerted on ground select transistors connected to each of the first to third ground select lines GSL0 to GSL2 may be advantageously reduced. In one or more examples, the first ground select line GSL0 may be between the first dummy line GDUM0 and the second dummy line GDUM1, the second ground select line GSL1 may be between the second dummy line GDUM1 and the third dummy line GDUM2, and the third ground select line GSL2 may be between the third dummy line GDUM2 and the fourth dummy line GDUM3. According to the embodiments described above, in each cell string, a ground select transistor connected to one of the first to third ground select lines GSL0 to GSL2 may be programmed to the first threshold voltage, and a ground select transistor connected to each of the other ones of the first to third ground select lines GSL0 to GSL2 may be programmed to the second threshold voltage.

Figure 11:
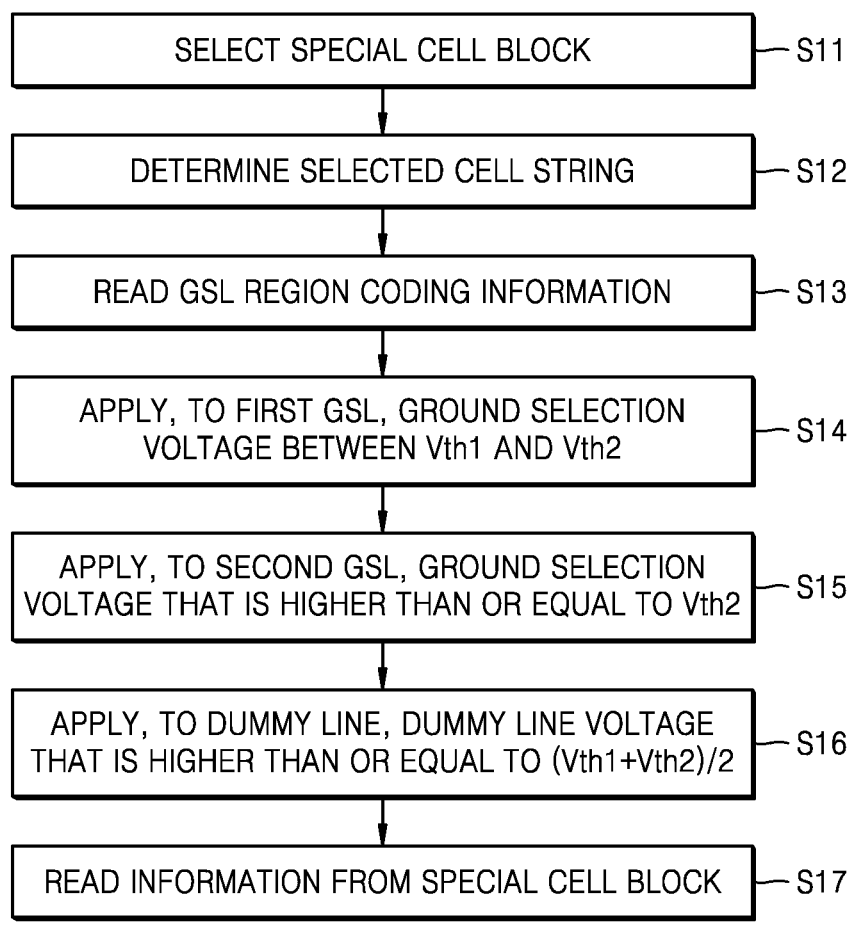
FIG. 11 is a flowchart of an operating method of a memory device, according to one or more embodiments.

FIG. 11 is a flowchart of an operating method of a memory device, according to one or more embodiments.

During the manufacture of a memory device, GSL region coding according to one or more embodiments may be performed, and GSL region coding information may be stored in a storage circuit, which stores information in the memory device in a non-volatile manner. The GSL region coding information may include information on threshold voltages of various lines in a GSL region or information on voltages provided to the various lines according to a selected cell string.

Referring to FIG. 11, during the initial operation of the memory device, at least one special cell block may be selected to set the operating environments of the memory device in operation S11, and a cell string selected from a plurality of cell strings connected to one bit line in the special cell block may be determined in operation S12. To determine information on voltages applied to various lines to read information from the special cell block, the GSL region coding information, which is stored in one or more non-volatile memory circuits of the memory device, may be read in operation S13, and a voltage level applied to each of the various lines may be adjusted based on the GSL region coding information.

In one or more embodiments, when the selected cell string includes first to third GSLs and a ground select transistor connected to the first GSL is programmed to the first threshold voltage Vth1, a ground selection voltage having a level between the first threshold voltage Vth1 and the second threshold voltage Vth2 may be applied to the first GSL in operation S14. Furthermore, when ground select transistors connected to the second and third GSLs are programmed to the second threshold voltage Vth2, a ground selection voltage having a level that is higher than or equal to the second threshold voltage Vth2 may be applied to the second and third GSLs in operation S15. In one or more embodiments, when dummy cells connected to at least one dummy line are programmed to a level corresponding to the average of the first threshold voltage Vth1 and the second threshold voltage Vth2, a dummy line voltage having a level that is higher than or equal to (Vth1+Vth2)/2 may be applied to the dummy line in operation S16. Based on the voltages respectively applied to the various lines in the GSL region, information may be read from the special cell block in operation S17. The operating environments of the memory device may be set based on the read information.

Figure 12A:
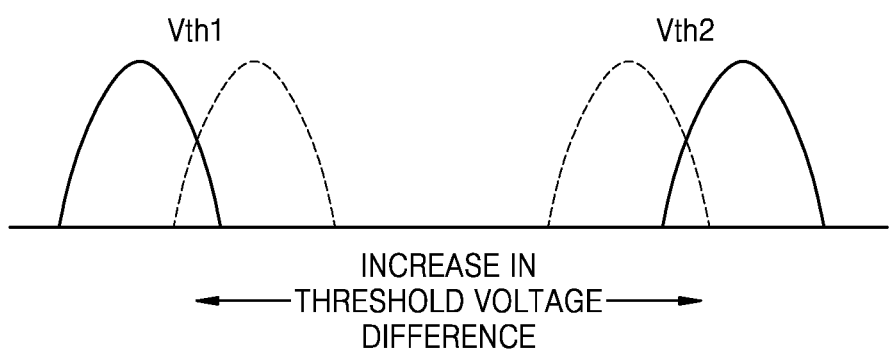
FIGS. 12A and 12B are diagrams illustrating GSL region coding according to one or more embodiments.
Figure 12B:
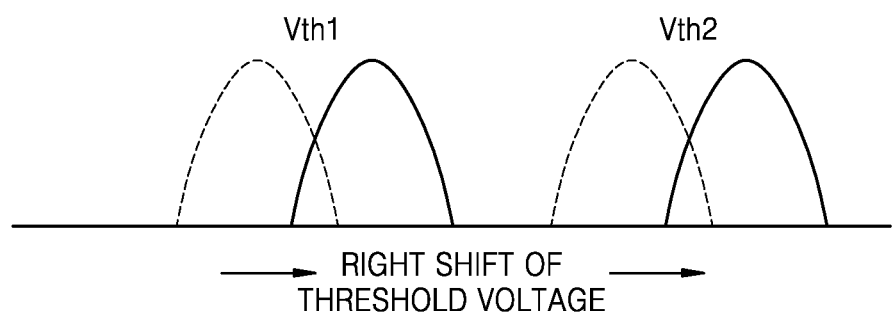

FIGS. 12A and 12B are diagrams illustrating GSL region coding According to one or more embodiments. In FIGS. 12A and 12B, a threshold voltage distribution of ground select transistors of a special cell block is marked with a solid line, and a threshold voltage distribution of ground select transistors of a normal cell block is marked with a dashed line.

In one or more embodiments, the GSL region of the special cell block may have the same line structure as the GSL region of the normal cell block. For example, each of the GSL region of the special cell block and the GSL region of the normal cell block may include a plurality of GSLs and a plurality of ground select transistors connected to each of the GSLs. As the GSL region of the special cell block has the same line structure as the GSL region of the normal cell block, each of the GSL region of the special cell block and the GSL region of the normal cell block may or may not include a dummy line.

In one or more embodiments, the GSL region of the special cell block may be coded through a different method than that of the GSL region of the normal cell block. For example, in each of the GSL region of the special cell block and the GSL region of the normal cell block, a cell string corresponding to one string select line may include a plurality of ground select transistors, and one of the ground select transistors may be programmed to a first threshold voltage while the other ground select transistors may be programmed to a second threshold voltage.

According to one or more embodiments, as shown in FIG. 12A, the difference between the first threshold voltage and the second threshold voltage in the GSL region of the special cell block may be greater than that in the GSL region of the normal cell block. Accordingly, even when the threshold voltage distribution is shifted or the characteristic of the threshold voltage distribution is degraded in the GSL region of the special cell block, the electrical separation characteristic of GSLs may be advantageously maintained, and the reliability of information stored in the special cell block may also be advantageously maintained.

As shown in FIG. 12B, the first threshold voltage distribution and the second threshold voltage distribution of the GSL region of the special cell block may be respectively shifted to the right compared to those of the GSL region of the normal cell block. Accordingly, even when there is a left shift of a threshold voltage due to high temperature or high pressure during the manufacture of a memory device, the left shift may be compensated for in the case of a special cell block, and therefore, the electrical separation characteristic of GSLs and the reliability of information stored in the special cell block may be advantageously maintained.

Figure 13:
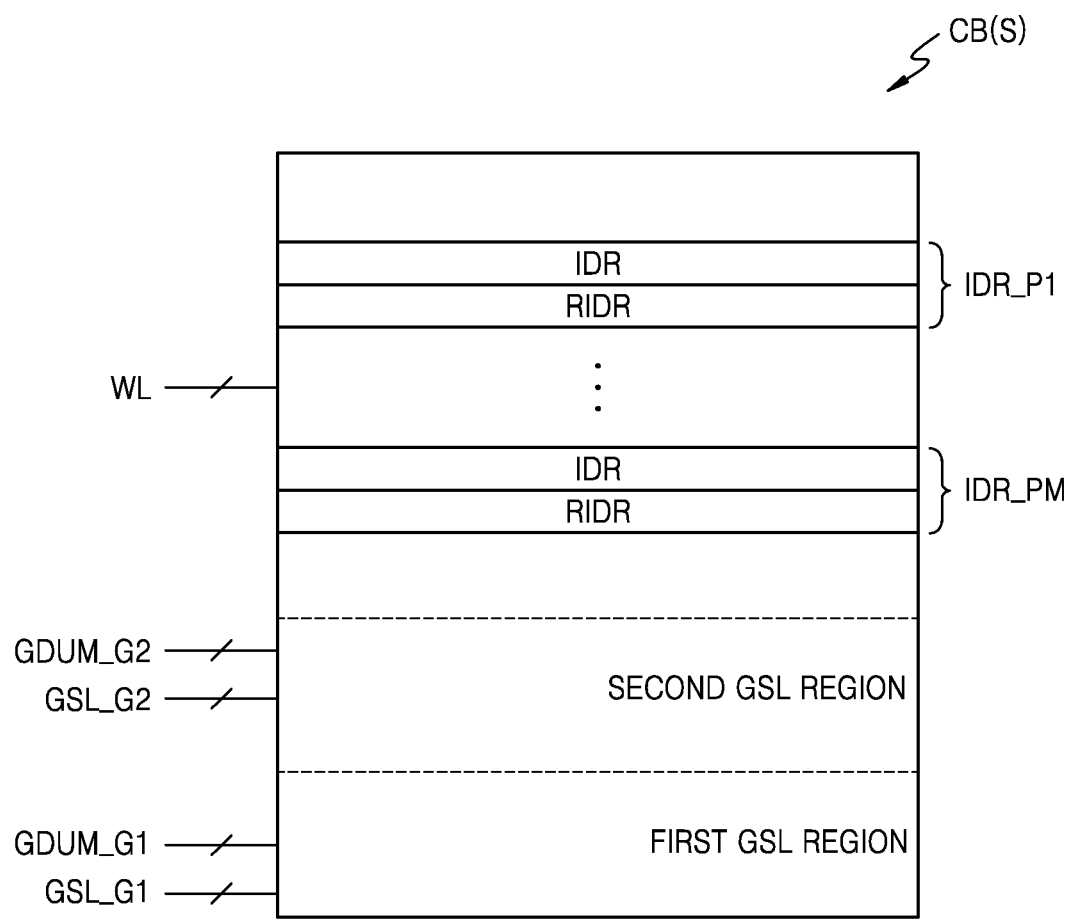
FIG. 13 is a diagram of an example implementation of a special cell block, according to some embodiments.

FIG. 13 is a diagram of a special cell block, according to some embodiments. FIG. 13 illustrates the case where a special cell block stores IDR data.

Referring to FIG. 13, the special cell block CB(S) may include an information storage region storing the IDR pairs IDR_P1 to IDR_PM. Each of the IDR pairs IDR_P1 to IDR_PM may include the IDR data IDR and the replica IDR data RIDR corresponding to the IDR data IDR. A plurality of word lines WL may be arranged in the information storage region.

The special cell block CB(S) may include a GSL region in which GSLs and/or dummy lines are arranged. In one or more embodiments, the special cell block CB(S) may include a first GSL region and a second GSL region. Each of the first GSL region and the second GSL region may include GSLs and/or dummy lines, according to the embodiments described above. For example, the first GSL region may include a first GSL group GSL_G1 and a first dummy line group GDUM_G1, and the second GSL region may include a second GSL group GSL_G2 and a second dummy line group GDUM_G2. Lines may be arranged in each of the first GSL region and the second GSL region to correspond to one of the GSL regions described in the embodiments described above. The first GSL region and the second GSL region may have the same line structure as each other or different line structures from each other.

During the manufacture of a memory device, the IDR data IDR may be stored in the special cell block CB(S), and coding may be performed on each of the first GSL region and the second GSL region. Thereafter, during the initial operation of the memory device, the IDR data IDR may be read from the special cell block CB(S) to set the operating environments of the memory device. During the reading of the IDR data IDR, one of the first GSL region and the second GSL region may be selectively enabled.

In one or more examples, when the first GSL region is enabled, various voltages may be provided to the first GSL group GSL_G1 and the first dummy line group GDUM_G1 in the first GSL region to read information from the information storage region of the special cell block CB(S). For example, according to the embodiments described above, for the electrical separation between a selected cell string and unselected cell strings, a ground selection voltage having a level between the first threshold voltage and the second threshold voltage may be provided to one or more GSLs in the first GSL group GSL_G1. Furthermore, to turn on dummy cells connected to the first dummy line group GDUM_G1, a pass voltage may be applied to the first dummy line group GDUM_G1.

As described above, while the first GSL region is enabled, the pass voltage may be applied to the second GSL group GSL_G2 and the second dummy line group GDUM_G2 in the second GSL region such that the information storage region may be electrically connected to its sub region. In one or more embodiments, to turn on all ground select transistors programmed to the first threshold voltage and ground select transistors programmed to the second threshold voltage in the second GSL region, a ground selection voltage having a level that is higher than the second threshold voltage may be provided to the second GSL group GSL_G2 in the second GSL region. Furthermore, to turn on all dummy cells, a dummy line voltage that is higher than the threshold voltage of the dummy cells may be provided to the second dummy line group GDUM_G2.

When a read fail occurs with respect to the IDR data IDR read in a state where the first GSL region is enabled, the IDR data IDR may be newly read by applying the pass voltage to the first GSL region and enabling the second GSL region. For example, when an electrical separation characteristic between cell strings is degraded according to the shift of the threshold voltage distribution of the first GSL region, a read fail may occur with respect to the IDR data IDR due to the degradation of the electrical separation characteristic of the first GSL region, and accordingly, the IDR data IDR may be newly read in a state where the second GSL region is enabled.

Figure 14:
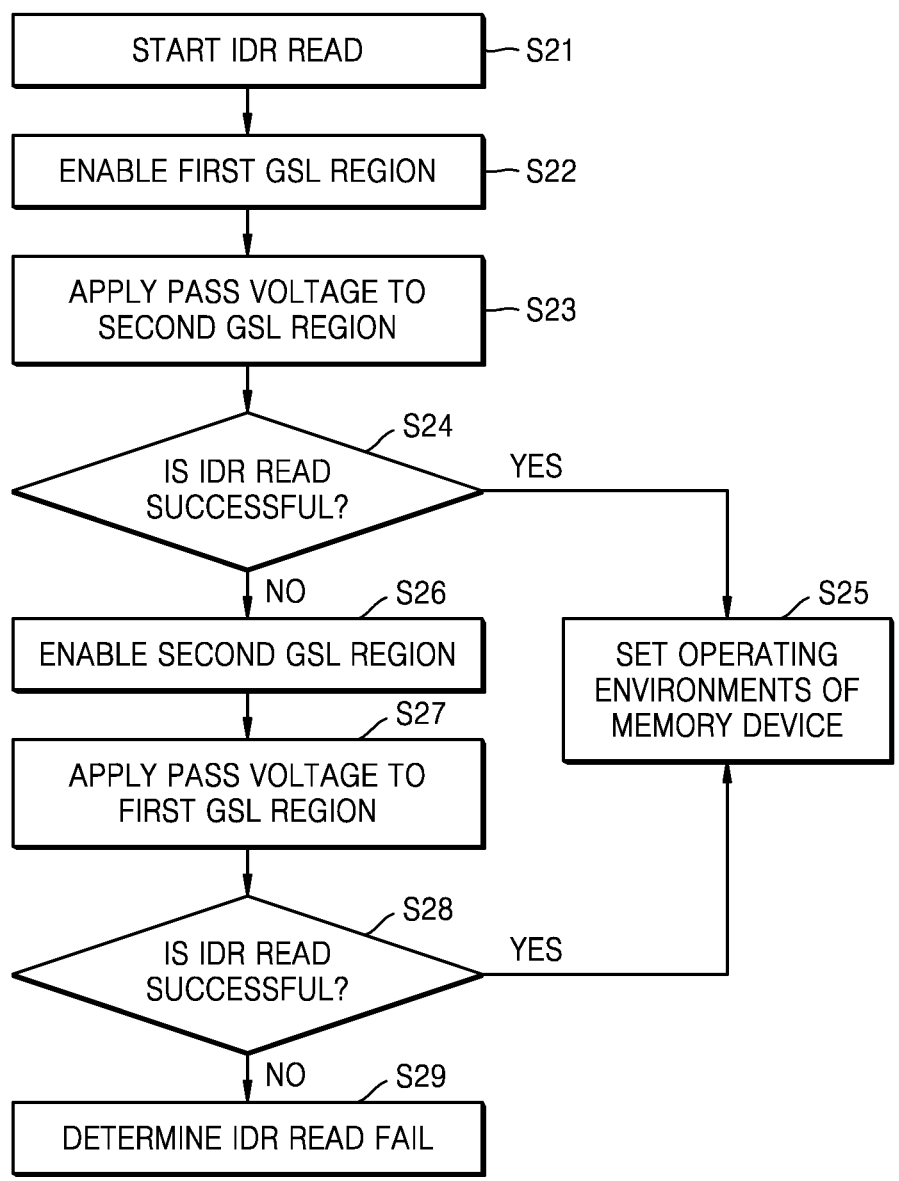
FIG. 14 is a flowchart of an example of an operation of reading IDR data from the special cell block of FIG. 13 according to one or more embodiments.

FIG. 14 is a flowchart of an example of an operation of reading the IDR data IDR from the special cell block CB(S) of FIG. 13.

Referring to FIGS. 13 and 14, during the initial operation of the memory device, a read operation of the IDR data IDR stored in the special cell block CB(S) may be started in operation S21. The special cell block CB(S) may include the first GSL region and the second GSL region, according to the embodiment described above. The IDR data IDR may be read in a state where the first GSL region is enabled in operation S22. During the reading of the IDR data IDR, a pass voltage may be applied to the lines (e.g., GSLs and/or dummy lines) of the second GSL region in operation S23.

The memory device may determine whether normal reading of the IDR data IDR is successful under control by a control logic in operation S24. When the reading of the IDR data IDR is successful, the operating environments of the memory device may be set by using the IDR data IDR in operation S25. When the reading of the IDR data IDR fails, reading of the replica IDR data RIDR or an IDR pair may be performed in a state where the first GSL region is enabled, and a recovery algorithm may be performed on the IDR data IDR.

When the reading of the IDR data IDR fails despite the recovery algorithm, the second GSL region may be enabled in operation S26. The IDR data IDR may be read in a state where the second GSL region is enabled. During the reading of the IDR data IDR, the pass voltage may be applied to the lines (e.g., GSLs and/or dummy lines) of the first GSL region in operation S27.

The memory device may determine whether the reading of the IDR data IDR is successful in the state where the second GSL region is enabled in operation S28. When the reading of the IDR data IDR is successful, the operating environments of the memory device may be set using the IDR data IDR in operation S25. When the reading of the IDR data IDR fails, an IDR read fail may be finally determined in operation S29.

Figure 15:
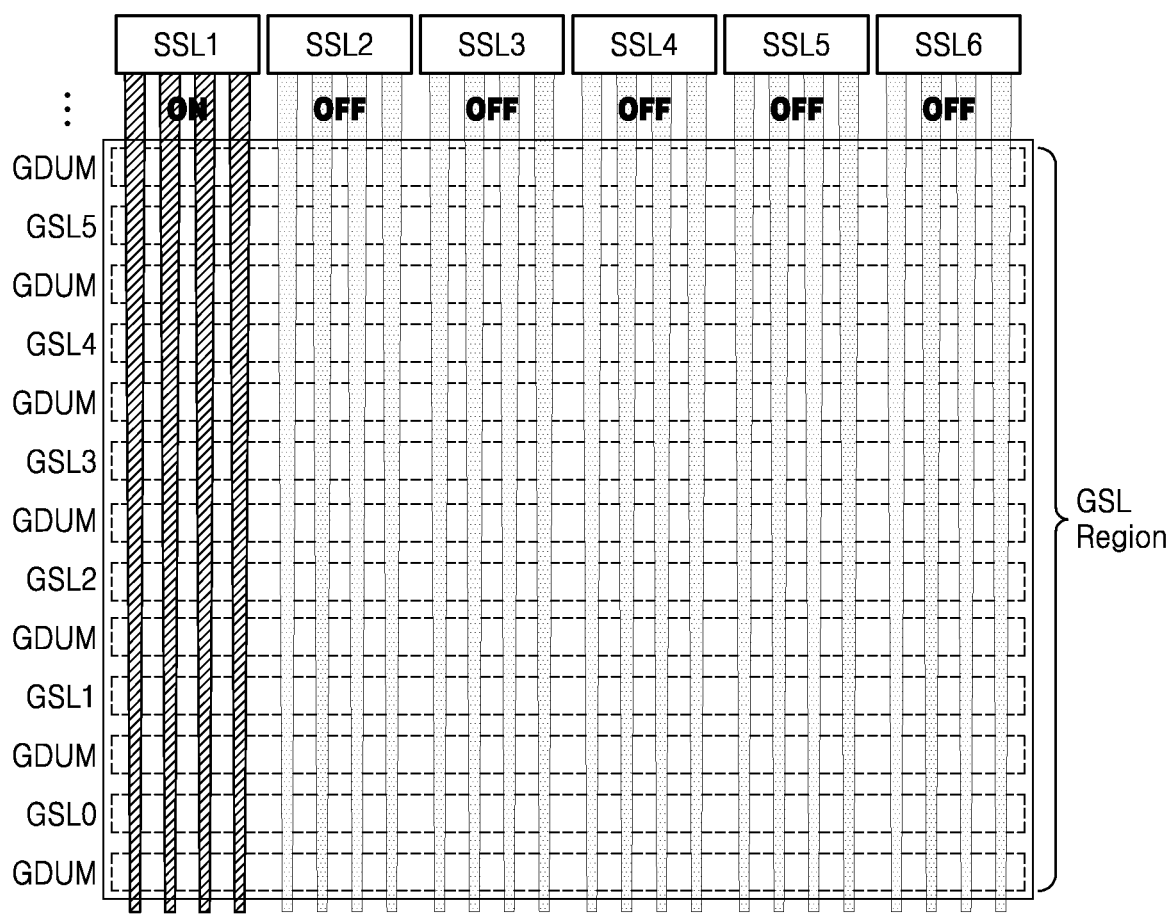
FIGS. 15 and 16 are diagrams illustrating example implementations of various GSL regions, according to one or more embodiments.
Figure 16:
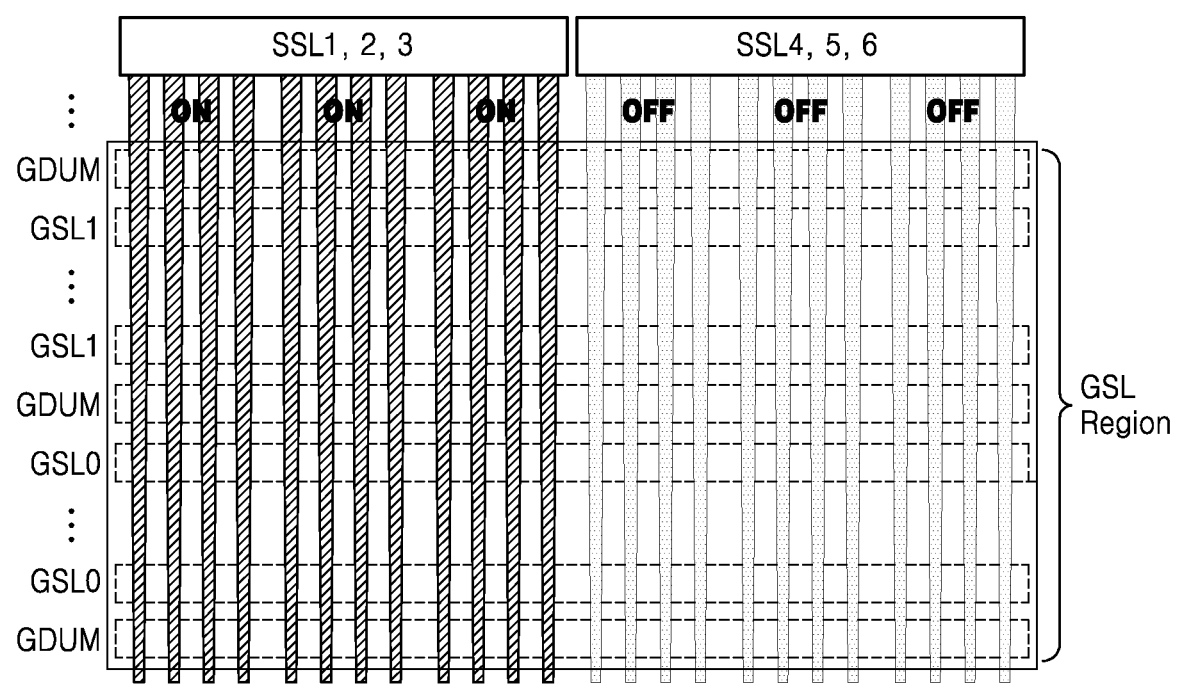

FIGS. 15 and 16 are diagrams of various GSL regions, according to one or more embodiments.

FIG. 15 illustrates the case where a GSL is electrically separated with respect to each of a plurality of string select lines. For example, the first to sixth string select lines SSL1 to SSL6 may be arranged in a special cell block, and the special cell block may include first to sixth ground select lines GSL0 to GSL5 in correspondence to the number of first to sixth string select lines SSL1 to SSL6.

In one or more embodiments, FIG. 15 illustrates the case where a dummy line is on both sides of each GSL. However, as understood by one of ordinary skill in the art, the embodiments are not limited these configurations. Various numbers of dummy lines may be arranged in the GSL region. In each of the first to sixth ground select lines GSL0 to GSL5, a ground select transistor corresponding to one string select line may be programmed to a first threshold voltage, and the other ground select transistors corresponding to the remaining string lines may be programmed to a second threshold voltage. Dummy cells connected to a plurality of dummy lines in the GSL region may be programmed to a level between the first threshold voltage and the second threshold voltage.

According to one or more embodiments, each GSL may be electrically separated with respect to each of a plurality of string select lines (or cell strings), and the electrical separation characteristic of the GSL in the special cell block may be improved.

FIG. 16 illustrates the case where the number of GSLs in the GSL region decreases while the number of portions into which a GSL is electrically separated decreases. For example, the first to sixth string select lines SSL1 to SSL6 may be arranged in a special cell block, and the special cell block may include a fewer number of GSLs (e.g., the first and second ground select lines GSL0 and GSL1) than the first to sixth string select lines SSL1 to SSL6. According to the structure described above, each GSL may include two electrically separated portions in correspondence to a group of the first to third string select lines SSL1 to SSL3 and a group of the fourth to sixth string select lines SSL4 to SSL6. Furthermore, in one GSL, ground select transistors corresponding to each of the first to third string select lines SSL1 to SSL3 may be programmed to the first threshold voltage while transistors corresponding to each of the fourth to sixth string select lines SSL4 to SSL6 may be programmed to the second threshold voltage.

In one or more embodiments, FIG. 16 illustrates the case where there are a plurality of first ground select lines GSL0 and a plurality of second ground select lines GSL1. For example, the first ground select lines GSL0 may be arranged between dummy lines GDUM, and the second ground select lines GSL1 may be arranged between dummy lines GDUM.

The first ground select lines GSL0 may be programmed to threshold voltages to have the same electrical separation characteristic as each other, and the second ground select lines GSL1 may be programmed to threshold voltages to have the same electrical separation characteristic as each other.

Figure 17:
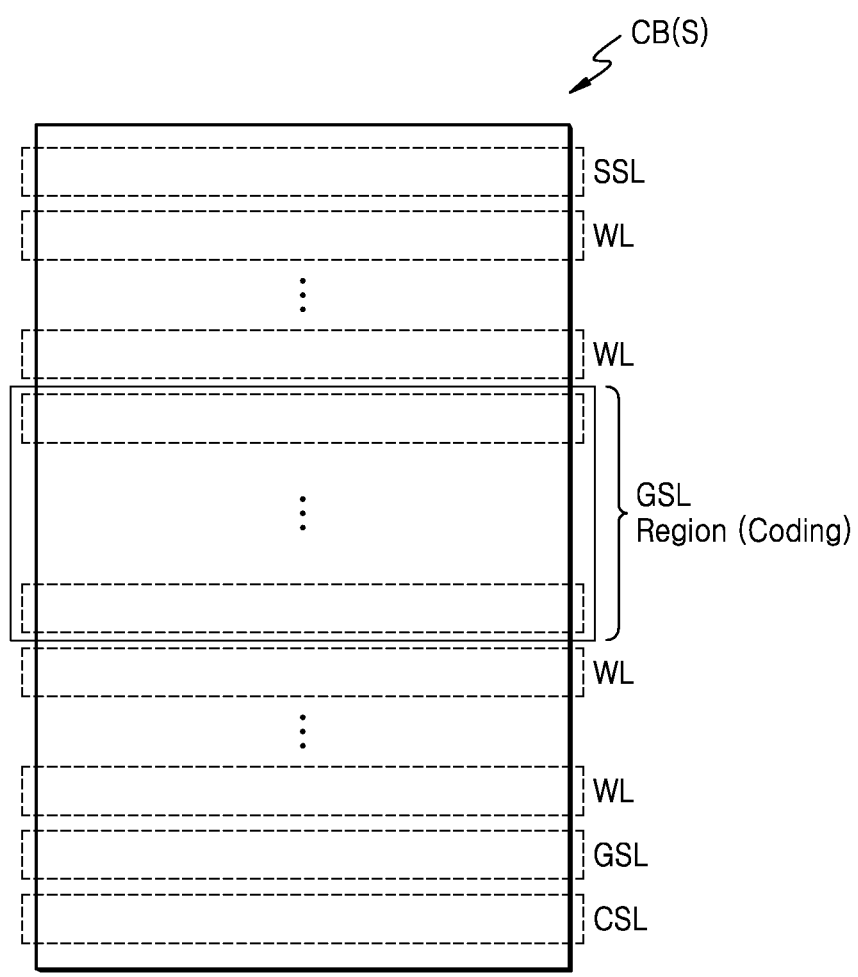
FIG. 17 is a diagram of an example implementation of a special cell block, according to some embodiments.

FIG. 17 is a diagram of an example implementation of a special cell block, according to some embodiments.

Referring to FIG. 17, the special cell block CB(S) may include a string select line SSL, a plurality of word lines WL, a ground select line GSL, and a common source line CSL. According to one or more embodiments, the special cell block CB(S) may include a GSL region on which coding is performed. The GSL region may include a plurality of GSLs and at least one dummy line, according to the embodiments described above.

In one or more embodiments, the GSL region may be located in the special cell block CB(S) but not adjacent to the common source line CSL. For example, the GSL region may include a plurality of lines arranged between word lines WL. According to the embodiments described above, based on a position of a selected cell string among a plurality of cell strings, a voltage having a level between a first threshold voltage and a second threshold voltage may be provided to at least one of the GSLs in the GSL region.

Figure 18:
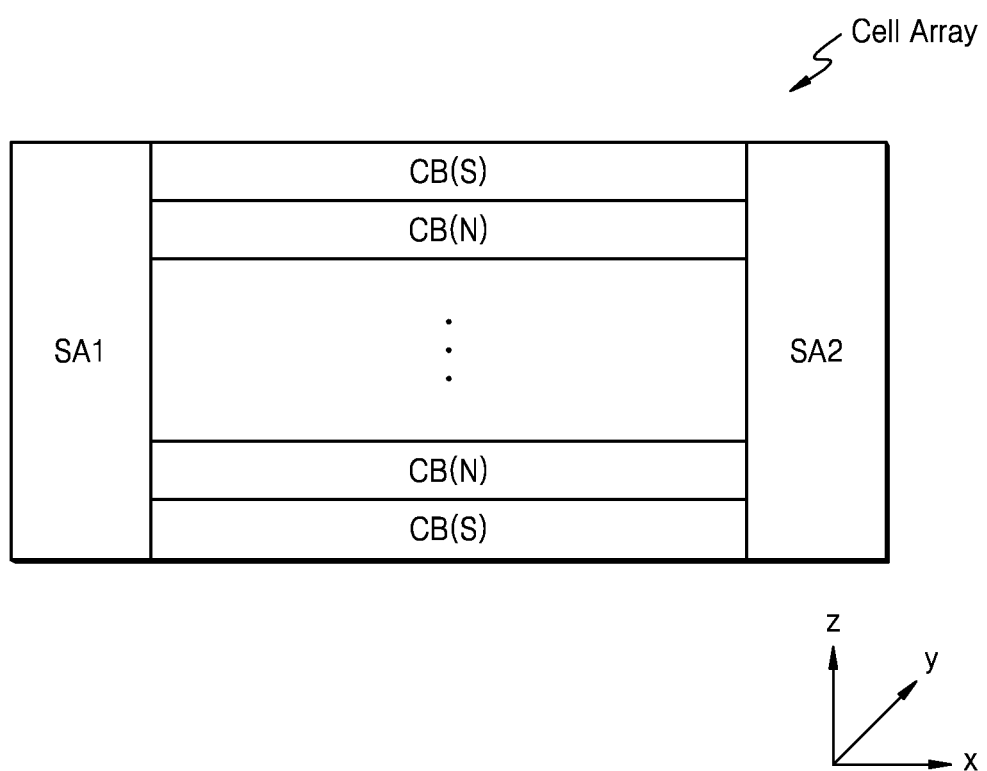
FIG. 18 is a diagram of an example implementation of a memory device according to some embodiments.

FIG. 18 is a diagram of a memory device according to some embodiments.

Referring to FIG. 18, the memory device may include a plurality of cell arrays. When the memory device has a vertical NAND (VNAND) structure, one or more step areas SA1 and SA2 having pads transmitting a word line voltage may be arranged in the memory device. In the step areas SA1 and SA2, a plurality of word lines may be stacked in the z-direction, bit lines may be arranged in the y-direction, and a word line cut may be arranged in the x-direction.

In each cell array, a plurality of cell blocks may be arranged in the y-direction. In one or more examples, one or more of the cell blocks may correspond to edge blocks in the edge region of the VNAND structure. For example, each of the cell blocks may include at least one pillars passing therethrough in the z-direction. The characteristic of a pillar in an edge block may be degraded compared to that in a center block, and accordingly, data reliability may be degraded.

For example, an edge block may be used for data other than user data (e.g., test information for a test or control information). According to one or more embodiments, at least some of the edge blocks of the cell array may be used as special cell blocks CB(S), and accordingly, a GSL region, according to one or more embodiments, may be arranged in each edge block used as a special cell block CB(S). For example, a plurality of GSLs and at least one dummy line may be arranged in the edge block, and coding may be applied to the GSLs and the dummy line, according to one or more embodiments.

Figure 19A:
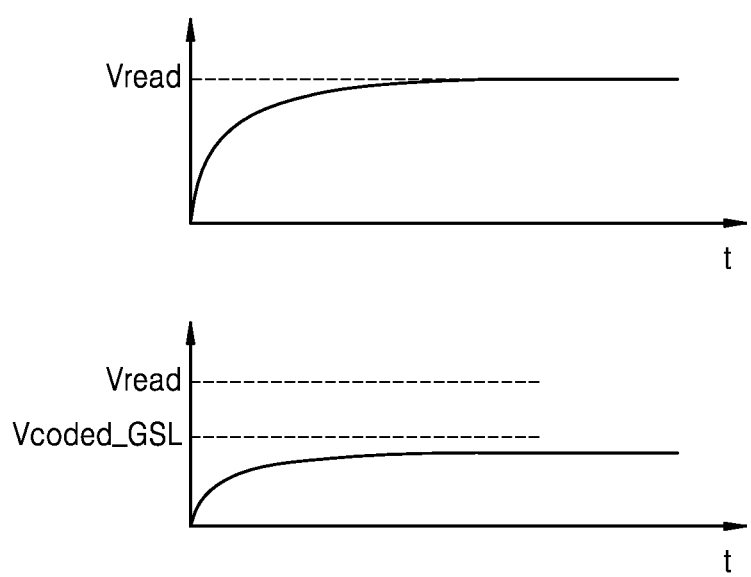
FIGS. 19A to 19C are waveform diagrams illustrating an example operation of a memory device, according to one or more embodiments.
Figure 19B:
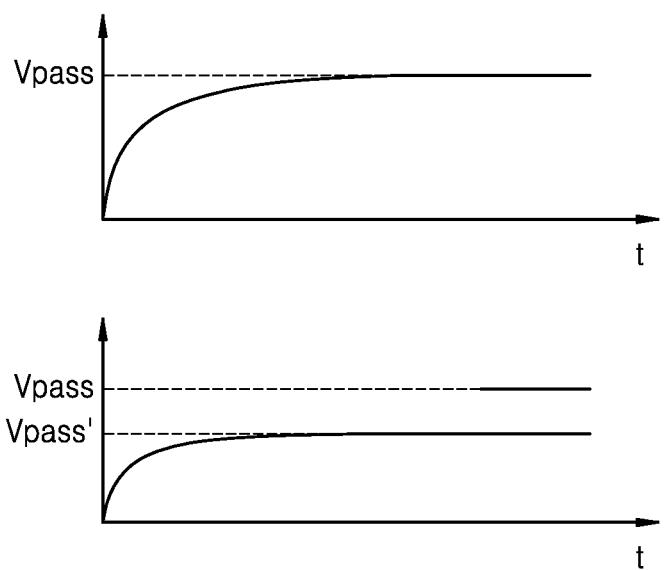
Figure 19C:
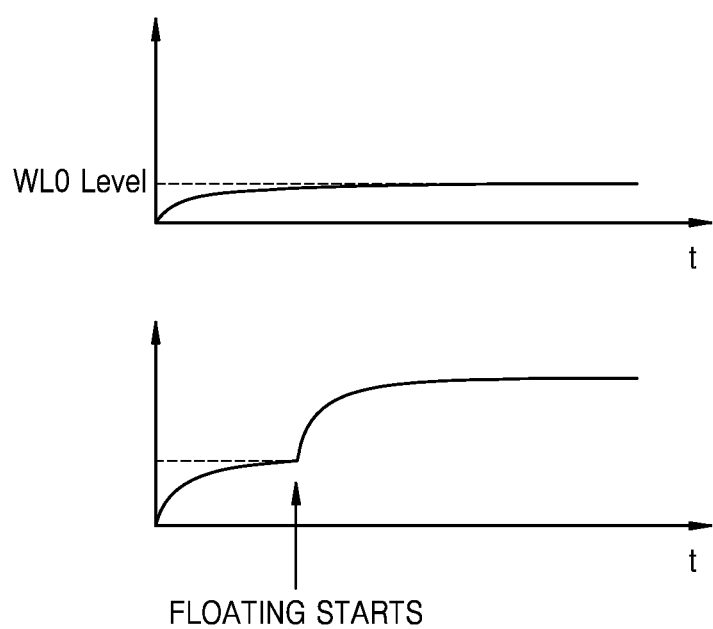

FIGS. 19A to 19C are waveform diagrams illustrating an example operation of a memory device, According to one or more embodiments.

Referring to FIG. 19A, because the memory device includes both a special cell block and a normal cell block, the special cell block may operate differently from the normal cell block with respect to a line at the same height. For example, regarding a read operation, at the same height, a word line (e.g., WL0) connected to a memory cell storing user data may be arranged in the normal cell block while a GSL programmed to a first threshold voltage or a second threshold voltage may be arranged in the special cell block. When a word line other than the word line WL0 is selected, a read voltage Vread corresponding to a pass voltage, which has a higher level than a threshold voltage according to a program state, may be applied to the word line WL0. In one or more examples, because a coded GSL is arranged at the same height in the special cell block, a voltage Vcoded_GSL having a level that is related to the first and second threshold voltages and lower than the read voltage Vread may be provided to the coded GSL. For example, a voltage having a level between the first threshold voltage and the second threshold voltage may be provided to the coded GSL.

Referring to FIG. 19B, when a program operation is performed on a word line other than the word line WL0, a pass voltage Vpass having a relatively high level may be applied to the word line WL0. In one or more examples, the threshold voltage distribution of ground select transistors in the coded GSL region of the special cell block may be different from the threshold voltage distribution of the normal cell block, and accordingly, an optimal pass voltage for the special cell block may be different from the pass voltage Vpass for the normal cell block. FIG. 19B illustrates the case where a pass voltage Vpass' provided to the special cell block is lower than the pass voltage Vpass provided to the normal cell block.

Referring to FIG. 19C, regarding an erase operation, memory cells may be connected, at the same height, to a line of the normal cell block while coded ground select transistors may be connected to a line of the special cell block. In the erase operation, the memory cells connected to the line of the normal cell block need to be erased, but the threshold voltage level of the ground select transistors connected to the line of the special cell block, which is at the same height as the line of the normal cell block, need to be maintained. Accordingly, as shown in FIG. 19C, a voltage having a relatively low level may be applied to the word line WL0 of the normal cell block in the erase operation such that memory cells connected to the word line WL0 may be erased. In one or more examples, a certain high voltage may be provided to a GSL of the special cell block, which is at the same height as the word line WL0 to apply floating, and accordingly, a control operation may be performed such that the threshold voltage level of coded ground select transistors is not changed.

Figure 20:
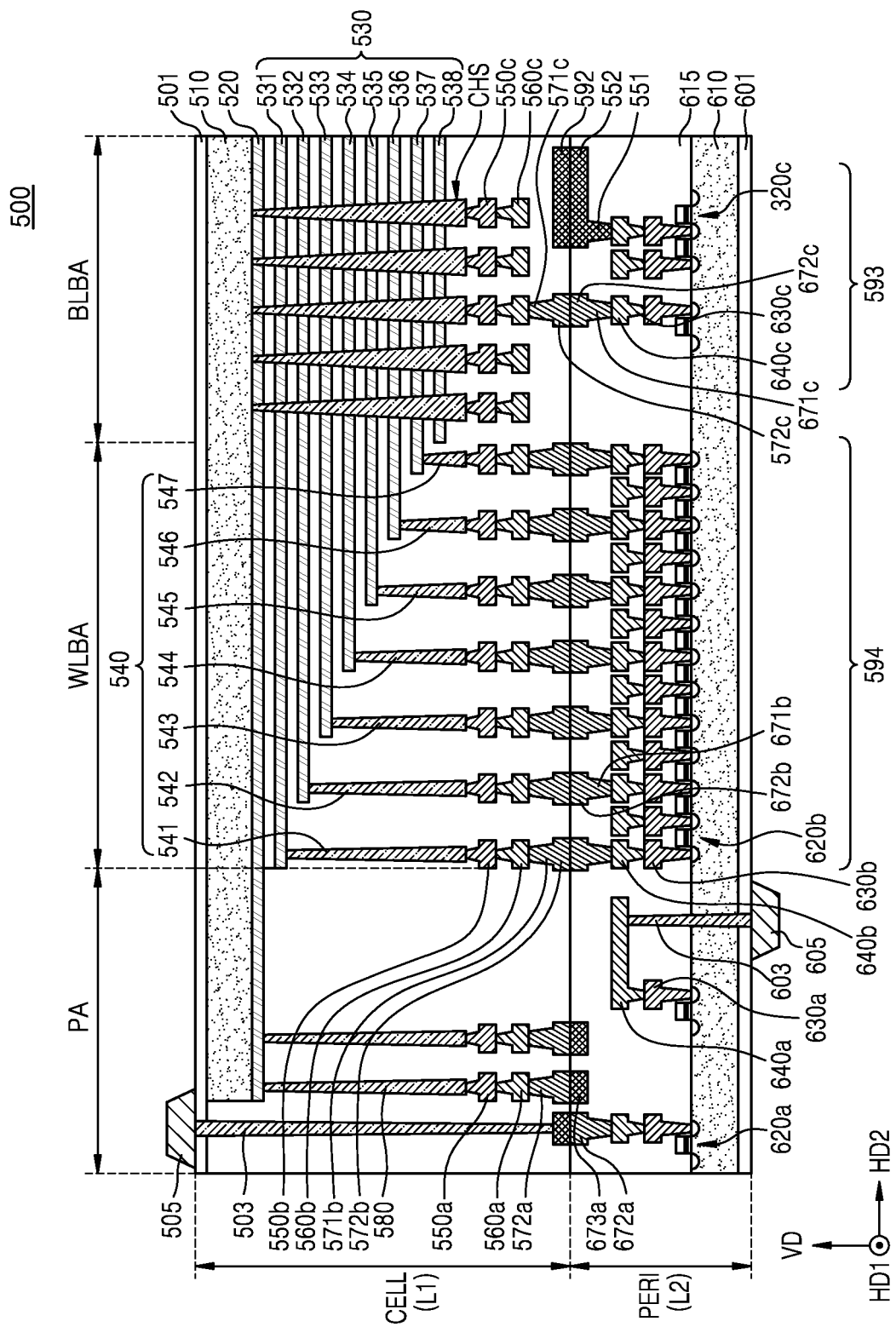
FIG. 20 is a cross-sectional view of a memory device having a bonding vertical NAND (B-VNAND) structure, according to one or more embodiments.

FIG. 20 is a cross-sectional view of a memory device 500 having a bonding VNAND (B-VNAND) structure, according to one or more embodiments.

Referring to FIG. 20, a cell region CELL of the memory device 500 may correspond to a first semiconductor layer L1, and a peripheral circuit region PERI of the memory device 500 may correspond to a second semiconductor layer L2. Each of the peripheral circuit region PERI and the cell region CELL of the memory device 500 may include an external pad bonding area PA, a word line bonding area WLBA, and a bit line bonding area BLBA. For example, the word lines WL, the string select lines SSL, the ground select lines GSL, and the memory cell array 310 in FIG. 20 may be formed in the first semiconductor layer L1, and the control logic 322, the page buffer 321, the voltage generator 323, and the row decoder 324 in FIG. 20 may be formed in the second semiconductor layer L2.

The peripheral circuit region PERI may include a first substrate 610, an interlayer insulating layer 615, a plurality of circuit elements 620a, 620b, and 620c formed on the first substrate 610, first metal layers 630a, 630b, and 630c respectively connected to the plurality of circuit elements 620a, 620b, and 620c, and second metal layers 640a, 640b, and 640c formed on the first metal layers 630a, 630b, and 630c. In one or more embodiments, the first metal layers 630a, 630b, and 630c may include tungsten having relatively high resistivity, and the second metal layers 640a, 640b, and 640c may include copper having relatively low resistivity.

Although only the first metal layers 630a, 630b, and 630c and the second metal layers 640a, 640b, and 640c are shown in FIG. 20, as understood by one of ordinary skill in the art, the embodiments are not limited thereto, and one or more additional metal layers may be further formed on the second metal layers 640a, 640b, and 640c. At least a portion of the one or more additional metal layers formed on the second metal layers 640a, 640b, and 640c may include aluminum, or any other suitable material known to one of ordinary skill in the art, having a lower resistivity than that of copper forming the second metal layers 640a, 640b, and 640c.

The interlayer insulating layer 615 may be disposed on the first substrate 610 and cover the plurality of circuit elements 620a, 620b, and 620c, the first metal layers 630a, 630b, and 630c, and the second metal layers 640a, 640b, and 640c. The interlayer insulating layer 615 may include an insulating material, such as silicon oxide, silicon nitride, or any other suitable material known to one of ordinary skill in the art. Lower bonding metals 671b and 672b may be formed on the second metal layer 640b in the word line bonding area WLBA. In the word line bonding area WLBA, the lower bonding metals 671b and 672b of the peripheral circuit region PERI may be electrically bonded to upper bonding metals 571b and 572b of the cell region CELL. The lower bonding metals 671b and 672b and the upper bonding metals 571b and 572b may include aluminum, copper, tungsten, or any other suitable material known to one of ordinary skill in the art.

The cell region CELL may include at least one cell block. The cell region CELL may include a second substrate 510 and a common source line 520. A plurality of word lines 531 to 538 (i.e., 530) may be stacked on the second substrate 510 in a vertical direction VD that is perpendicular to the top surface of the second substrate 510. String select lines and a GSL may be respectively arranged on and below the word lines 530, and the word lines 530 may be between the string select lines and the GSL.

In the bit line bonding area BLBA, a channel structure CHS may extend in the vertical direction VD that is perpendicular to the top surface of the second substrate 510 and may pass through the word lines 530, the string select lines, and the GSL. The channel structure CHS may include a data storage layer, a channel layer, a buried insulating layer, or any other layer known to one of ordinary skill in the art. The channel layer may be electrically connected to a first metal layer 550c and a second metal layer 560c. For example, the first metal layer 550c may be referred to as a bit line contact 550c, and the second metal layer 560c may be referred to as a bit line 560c. In one or more embodiments, the bit line 560c may extend in a second horizontal direction HD2 that is parallel to the top surface of the second substrate 510.

In one or more embodiments, an area in which the channel structure CHS, the bit line 560c, and any other suitable component are arranged may be defined as the bit line bonding area BLBA. In the bit line bonding area BLBA, the bit line 560c may be electrically connected to the circuit elements 620c providing a page buffer 593 in the peripheral circuit region PERI. For example, the bit line 560c may be connected to upper bonding metals 571c and 572c in the cell region CELL, and the upper bonding metals 571c and 572c may be connected to lower bonding metals 671c and 672c connected to the circuit elements 620c of the page buffer 593. Accordingly, the page buffer 593 may be connected to the bit line 560c through the upper and lower bonding metals 571c, 572c, 671c, and 672c.

In one or more embodiments, the memory device 500 may further include a through-hole via in the bit line bonding area BLBA. The through-hole via THV may pass through the word lines 530 and extend in the vertical direction VD. The through-hole via THV may be connected to the common source line 520 and/or the second substrate 510. In one or more examples, an insulating ring may be around the through-hole via THV, and the through-hole via THV may be insulated from the word lines 530. The through-hole via THV may be connected to the peripheral circuit region PERI through an upper bonding metal 572d and a lower bonding metal 672d.

In the word line bonding area WLBA, the word lines 530 may extend in a first horizontal direction HD1 that is parallel to the top surface of the second substrate 510 and may be connected to a plurality of cell contact plugs 541 to 547 (e.g., 540). The word lines 530 and the cell contact plugs 540 may be connected to each other in pads provided by at least respective portions of the word lines 530 extending in different lengths in the second horizontal direction HD2 along the vertical direction VD. A first metal layer 550b and a second metal layer 560b may be sequentially connected to an upper portion of each of the cell contact plugs 540 connected to the word lines 530. The cell contact plugs 540 may be connected to the peripheral circuit region PERI by the upper bonding metals 571b and 572b of the cell region CELL and the lower bonding metals 671b and 672b of the peripheral circuit region PERI in the word line bonding area WLBA.

The cell contact plugs 540 may be electrically connected to the circuit elements 620b providing a row decoder 594 in the peripheral circuit region PERI. In one or more embodiments, operating voltages of the circuit elements 620b providing the row decoder 594 may be different than operating voltages of the circuit elements 620c providing the page buffer 593. For example, operating voltages of the circuit elements 620c providing the page buffer 593 may be greater than operating voltages of the circuit elements 620b providing the row decoder 594.

A common source line contact plug 580 may be in the external pad bonding area PA. The common source line contact plug 580 may include a conductive material, such as a metal, a metal compound, polysilicon, or any other suitable material known to one of ordinary skill in the art, and may be electrically connected to the common source line 520. A first metal layer 550a and a second metal layer 560a may be sequentially stacked on an upper portion of the common source line contact plug 580. For example, an area in which the common source line contact plug 580, the first metal layer 550a, and the second metal layer 560a are arranged may be defined as the external pad bonding area PA.

A first input-output pad 605 and a second input-output pad 505 may be arranged in the external pad bonding area PA. A lower insulating film 601 covering the bottom surface of the first substrate 610 may be formed below the first substrate 610, and the first input-output pad 605 may be formed on the lower insulating film 601. The first input-output pad 605 may be connected to at least one of the circuit elements 620a, 620b, and 620c in the peripheral circuit region PERI through a first input-output contact plug 603 and may be separated from the first substrate 610 by the lower insulating film 601. Furthermore, a side insulating film may be between the first input-output contact plug 603 and the first substrate 610 to electrically separate the first input-output contact plug 603 from the first substrate 610.

An upper insulating film 501 covering the top surface of the second substrate 510 may be on the second substrate 510, and the second input-output pad 505 may be on the upper insulating layer 501. The second input-output pad 505 may be connected to at least one of the circuit elements 620a, 620b, and 620c in the peripheral circuit region PERI through a second input-output contact plug 503.

According to one or more embodiments, the second substrate 510 and the common source line 520 may not be arranged in an area in which the second input-output contact plug 503 is arranged. In one or more examples, the second input-output pad 505 may not overlap with the word lines 530 in the vertical direction VD. The second input-output contact plug 503 may be separated from the second substrate 510 in a direction that is parallel with the top surface of the second substrate 510 and may be connected to the second input-output pad 505 through an interlayer insulating layer of the cell region CELL.

According to one or more embodiments, the first input-output pad 605 and the second input-output pad 505 may be selectively formed. For example, the memory device 500 may include only the first input-output pad 605 on the first substrate 610 or only the second input-output pad 505 on the second substrate 510. In one or more examples, the memory device 500 may include both the first input-output pad 605 and the second input-output pad 505. In each of the external pad bonding area PA and the bit line bonding area BLBA respectively included in the cell region CELL and the peripheral circuit region PERI, a metal pattern of a topmost metal layer may be provided as a dummy pattern, or the topmost metal layer may be absent.

In the external pad bonding area PA, the memory device 500 may include a lower metal pattern 673a, which corresponds to an upper metal pattern 572a formed in the topmost metal layer of the cell region CELL and has the same shape as the upper metal pattern 572a, in the topmost metal layer of the peripheral circuit region PERI. The lower metal pattern 673a formed in the topmost metal layer of the peripheral circuit region PERI may not be connected to a contact in the peripheral circuit region PERI. In one or more examples, in the external pad bonding area PA, an upper metal pattern having the same shape as a lower metal pattern formed in the topmost metal layer of the peripheral circuit region PERI may be formed in the topmost metal layer of the cell region CELL in correspondence to the lower metal pattern of the peripheral circuit region PERI.

The lower bonding metals 671b and 672b may be formed on the second metal layer 640b in the word line bonding area WLBA. In the word line bonding area WLBA, the lower bonding metals 671b and 672b of the peripheral circuit region PERI may be electrically connected to the upper bonding metals 571b and 572b of the cell region CELL by a bonding manner.

Furthermore, in the bit line bonding area BLBA, an upper metal pattern 592 having the same shape as a lower metal pattern 552 formed in the topmost metal layer of the peripheral circuit region PERI may be formed in the topmost metal layer of the cell region CELL in correspondence to the lower metal pattern 552. A contact may not be formed on the upper metal pattern 592 in the topmost metal layer of the cell region CELL.

Figure 21:
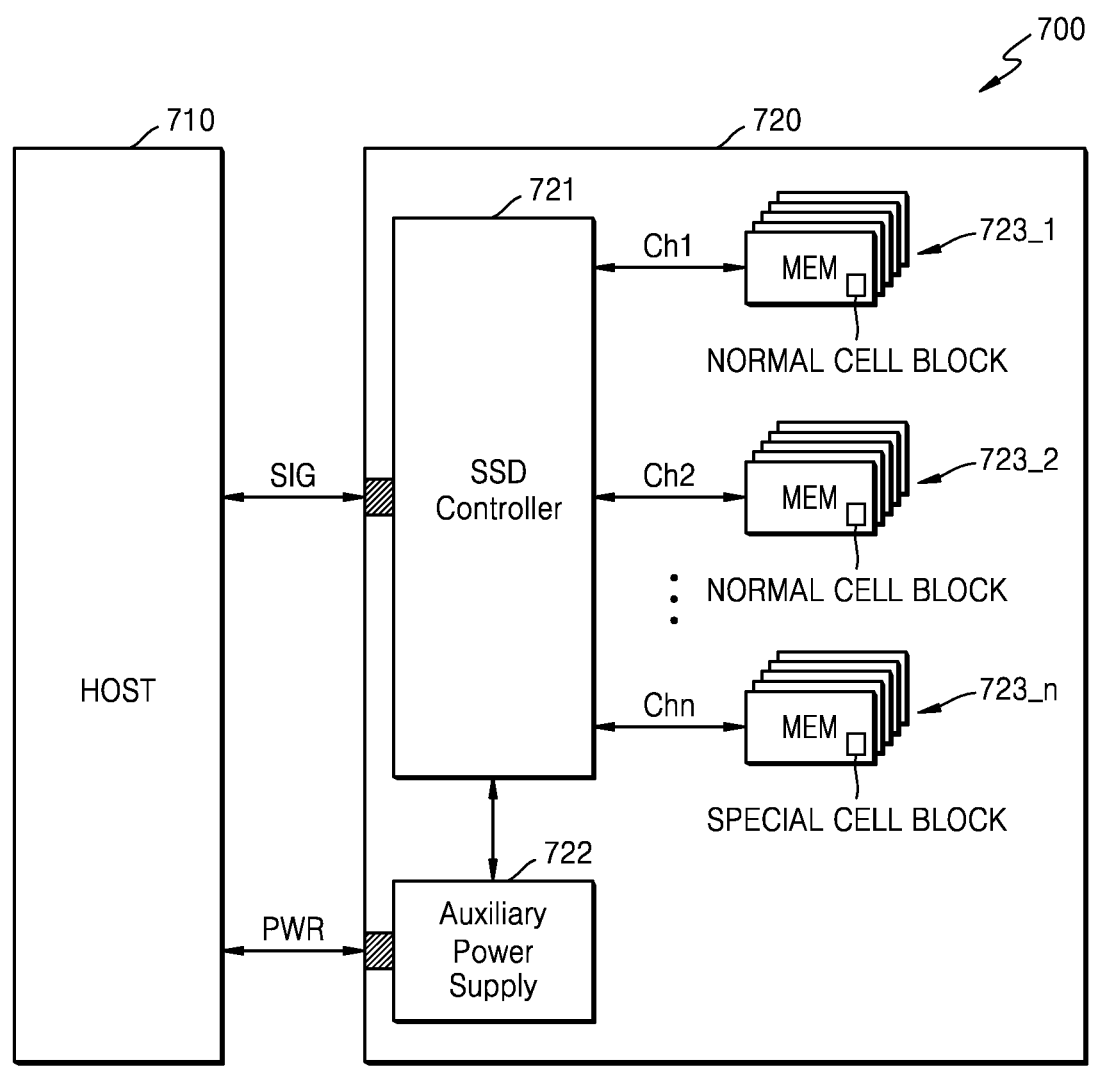
FIG. 21 is a block diagram of an example of applying a memory device to a solid state drive (SSD) system, according to one or more embodiments.

FIG. 21 is a block diagram of an example of applying a memory device to an SSD system, according to one or more embodiments.

Referring to FIG. 21, an SSD system 700 may include a host 710 and an SSD 720. The SSD 720 may exchange signals SIG with the host 710 through a signal connector and may receive power PWR through a power connector. The SSD 720 may include an SSD controller 721, an auxiliary power supply 722, and memory devices 723_1 to 723_n. The memory devices 723_1 to 723_n may include a vertical stack NAND flash memory device. In one or more examples, the SSD 720 may be realized using the embodiments described above with reference to FIGS. 1 to 20. For example, each of the memory devices 723_1 to 723_n of the SSD 720 may include a plurality of cell blocks, and at least one of the cell blocks may correspond to a special cell block. A GSL region of the special cell block may have any one of the structures described above with reference to FIG. 1 to 20 or may be coded according to the method described above with reference to FIGS. 1 to 20.

A special cell block according to one or more embodiments may be provided in chip units. For example, a special cell block according to one or more embodiments may be provided in some of memory chips of the memory devices 723_1 to 723_n, and only a normal cell block may be provided in the other memory chips. Accordingly, regarding the memory devices 723_1 to 723_n, some memory chips including a special cell block may be differently implemented, controlled, and used than the other memory chips including a normal cell block. FIG. 21 illustrates the case where a normal cell block is provided in the memory devices 723_1 and 7232 while a special cell block is provided in the other memory device 723_n.

While the embodiments of the present disclosure have been particularly shown and described with reference to embodiments thereof, it will be understood that various changes in form and details may be made therein without departing from the spirit and scope of the following claims.

What is claimed is:

1. A memory device comprising:
   a memory cell array including a plurality of cell blocks including a first cell block storing information other than user data and a second cell block storing the user data, wherein each of the plurality of cell blocks includes a plurality of cell strings; and
   control circuitry configured to control a write operation and a read operation of the memory cell array,
   wherein a first ground select line (GSL) region included in the first cell block includes a plurality of GSLs stacked in a vertical direction,
   wherein one or more ground select transistors of a plurality of ground select transistors connected to each of the GSLs are programmed to a first threshold voltage and the other ground select transistors of the plurality of ground select transistors are programmed to a second threshold voltage that is higher than the first threshold voltage, and
   wherein, a first line included in the first GSL region in the first cell block is arranged at a same height as a word line connected to memory cells storing the user data in the second cell block.

2. The memory device of claim 1, wherein a second GSL region included in the second cell block includes at least one GSL between the word line and a common source line.

3. The memory device of claim 2, wherein a number of GSLs in the first GSL region is greater than a number of GSLs in the second GSL region.

4. The memory device of claim 1, wherein
   first to N-th cell strings are connected to a bit line in the first cell block, and string select transistors included in the first to N-th cell strings are separately controlled, where N is an integer of at least 2, and
   each of the first to N-th cell strings includes ground select transistors connected to N/A GSLs, where A is an integer greater than or equal to 1.

5. The memory device of claim 4, wherein,
   when A is 1, each of the first to N-th cell strings includes N ground select transistors,
   one of the N ground select transistors is programmed to the first threshold voltage, and the others of the N ground select transistors are programmed to the second threshold voltage.

6. The memory device of claim 4, wherein
   when A is 2, each of the first to N-th cell strings includes N/2 ground select transistors, where N is a multiple of 2, and
   one of the N/2 ground select transistors is programmed to the first threshold voltage, and the others of the N/2 ground select transistors are programmed to the second threshold voltage.

7. The memory device of claim 4, wherein
   when A is 3, each of the first to N-th cell strings includes N/3 ground select transistors, where N is a multiple of 3, and one of the N/3 ground select transistors is programmed to the first threshold voltage, and the others of the N/3 ground select transistors are programmed to the second threshold voltage.

8. The memory device of claim 1, wherein
the first GSL region further includes a first dummy line and a second dummy line, the first dummy line being adjacent to a common source line, and the second dummy line being above the plurality of GSLs, and
a first dummy cell and a second dummy cell connected to the first dummy line and the second dummy line, respectively, are programmed to a threshold voltage having a level between the first threshold voltage and the second threshold voltage.

9. The memory device of claim 2, wherein
the first cell block further includes a third GSL region including at least one dummy line and a plurality of GSLs, and
one of the first GSL region and the second GSL region is selectively enabled when the information stored in the first cell block is read.

10. The memory device of claim 9, wherein,
when the first GSL region is enabled, a voltage having a level between the first threshold voltage and the second threshold voltage is applied to some of the plurality of GSLs of the first GSL region, at least one ground select transistor of an unselected cell string among the plurality of cell strings is turned off,
a pass voltage that is higher than the second threshold voltage is applied to the plurality of GSLs of the third GSL region, and a plurality of ground select transistors of the third GSL region are turned on.

11. The memory device of claim 10, wherein,
when the reading of the information stored in the first cell block fails in a state where the first GSL region is enabled, the third GSL region is enabled, the pass voltage is applied to the ground select transistors of the first GSL region, and the information stored in the first cell block is newly read.

12. The memory device of claim 1, wherein the first cell block stores information data read (IDR) data during manufacturing of the memory device, the IDR data being related to one or more settings of the memory device.

13. The memory device of claim 1, wherein
the plurality of GSLs include first to third GSLs,
a plurality of first GSLs are between a first dummy line adjacent to a common source line and a second dummy line above the first dummy line, a plurality of second GSLs are between the second dummy line and a third dummy line above the second dummy line, and a plurality of third GSLs are between the third dummy line and a fourth dummy line above the third dummy line.

14. A memory device comprising:
a memory cell array including a first cell block storing information other than user data and a second cell block storing the user data, each of the first cell block and the second cell block including first to N-th cell strings connected to a bit line, where N is an integer greater than or equal to 2; and
control circuitry configured to control a write operation and a read operation of the memory cell array,
wherein each of the first to N-th cell strings of the first cell block includes first to M-th ground select transistors vertically stacked between a word line and a common source line, one of the first to M-th ground select transistors is programmed to a first threshold voltage, and the others of the first to M-th ground select transistors are programmed to a second threshold voltage that is higher than the first threshold voltage, where M is an integer greater than or equal to 2, and
each of the first to N-th cell strings of the second cell block includes first to N-th ground select transistors vertically stacked between the word line and the common source line, where N is an integer that is less than M.

15. The memory device of claim 14, wherein
each of the first to N-th cell strings of the first cell block further includes a first dummy cell above the first to M-th ground select transistors and a second dummy cell adjacent to the common source line, and
each of the first dummy cell and the second dummy cell is programmed to a threshold voltage having a level between the first threshold voltage and the second threshold voltage.

16. The memory device of claim 14, wherein
one or more of N ground select transistors included in the first to N-th cell strings of the first cell block and connected to a first ground select line are programmed to the first threshold voltage, and the others of the N ground select transistors are programmed to the second threshold voltage.

17. The memory device of claim 14, wherein,
one of the first to M-th ground select transistors is arranged in the first cell block at a same height as a memory cell storing the user data is arranged in the second cell block.

18. The memory device of claim 17, wherein,
in the read operation of the first cell block and the second cell block, a voltage having a level between the first threshold voltage and the second threshold voltage is applied to the first cell block at a same height as a read voltage for reading the user data of the memory cell is provided to the second cell block.

19. A memory device comprising:
a memory cell array including a first cell block storing information other than user data, the first cell block including first to N-th cell strings connected to a bit line, where N is an integer greater than or equal to 2; and
control circuitry configured to control a program operation and a read operation of the memory cell array,
wherein each of the first to N-th cell strings includes a plurality of first ground select transistors vertically stacked and having a first threshold voltage, a plurality of second ground select transistors vertically stacked and having a second threshold voltage that is higher than the first threshold voltage, and a plurality of third ground select transistors vertically stacked and having the second threshold voltage.

20. The memory device of claim 19, wherein
the plurality of third ground select transistors are above the plurality of second ground select transistors, the plurality of second ground select transistors are above the plurality of first ground select transistors,
at least one dummy cell is between a memory cell and the plurality of third ground select transistors, and the at least one dummy cell is programmed to a threshold voltage having a level between the first threshold voltage and the second threshold voltage.

* * * * *